United States Patent
Jiang et al.

(10) Patent No.: US 9,576,673 B2
(45) Date of Patent: Feb. 21, 2017

(54) SENSING MULTIPLE REFERENCE LEVELS IN NON-VOLATILE STORAGE ELEMENTS

(71) Applicant: SanDisk 3D LLC, Milpitas, CA (US)

(72) Inventors: Xiaowei Jiang, San Jose, CA (US); Chang Siau, Saratoga, CA (US); Siu Lung Chan, Santa Clara, CA (US)

(73) Assignee: SanDisk Technologies LLC, Plano, TX (US)

( * ) Notice: Subject to any disclaimer, the term of this patent is extended or adjusted under 35 U.S.C. 154(b) by 72 days.

(21) Appl. No.: 14/508,615

(22) Filed: Oct. 7, 2014

(65) Prior Publication Data

US 2016/0099070 A1    Apr. 7, 2016

(51) Int. Cl.
| | | |
|---|---|---|
| G11C 16/28 | (2006.01) | |
| G11C 16/04 | (2006.01) | |
| G11C 11/56 | (2006.01) | |
| G11C 16/26 | (2006.01) | |
| G11C 16/34 | (2006.01) | |

(52) U.S. Cl.
CPC .......... G11C 16/28 (2013.01); G11C 11/5642 (2013.01); G11C 16/0466 (2013.01); G11C 16/0483 (2013.01); G11C 16/26 (2013.01); G11C 16/3459 (2013.01); G11C 2211/5621 (2013.01)

(58) Field of Classification Search
CPC .. G11C 16/28; G11C 16/0466; G11C 16/0483
See application file for complete search history.

(56) References Cited

U.S. PATENT DOCUMENTS

| | | | | |
|---|---|---|---|---|
| 9,165,664 | B2 * | 10/2015 | D'Alessandro | G11C 16/26 |
| 2004/0057285 | A1 * | 3/2004 | Cernea | G11C 8/08 |
| | | | | 365/185.12 |
| 2006/0158935 | A1 | 7/2006 | Chan et al. | |
| 2008/0019185 | A1 * | 1/2008 | Li | G11C 8/10 |
| | | | | 365/185.22 |
| 2009/0040834 | A1 * | 2/2009 | Ogawa | G11C 7/067 |
| | | | | 365/185.21 |

(Continued)

OTHER PUBLICATIONS

International Search Report & The Written Opinion of the International Searching Authority dated Nov. 30, 2015, International Application No. PCT/US2015/051270.

*Primary Examiner* — Douglas King
(74) *Attorney, Agent, or Firm* — Vierra Magen Marcus LLP

(57) ABSTRACT

Disclosed herein are techniques for sensing multiple reference levels in non-volatile storage elements without changing the voltage on the selected word line. One aspect includes determining a first condition of a selected non-volatile storage element with respect to a first reference level based on whether a sensing transistor conducts in response to a sense voltage on a sense node. Then, a voltage on the source terminal of the sensing transistor is modified after determining the first condition with respect to the first reference level. A second condition of the selected non-volatile storage element is then determined with respect to a second reference level based on whether the sensing transistor conducts in response to the sense voltage on the sense node. This allows two different reference levels to be efficiently sensed. Dynamic power is saved due low capacitance of the sensing transistor relative to the sense node.

20 Claims, 25 Drawing Sheets

(56) References Cited

U.S. PATENT DOCUMENTS

| | | | |
|---|---|---|---|
| 2011/0235420 A1* | 9/2011 | Sharon | ................ G11C 11/5642 365/185.17 |
| 2013/0083607 A1 | 4/2013 | Joo et al. | |
| 2013/0100744 A1 | 4/2013 | She et al. | |
| 2014/0071761 A1 | 3/2014 | Sharon et al. | |
| 2014/0211568 A1 | 7/2014 | Mui et al. | |
| 2016/0071606 A1* | 3/2016 | Kodama | ................ G11C 16/26 365/185.21 |

* cited by examiner

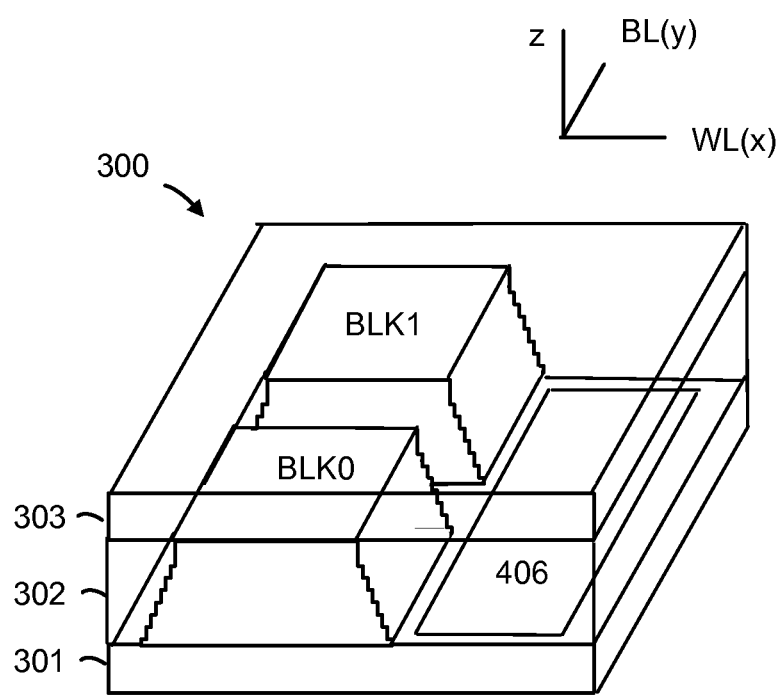

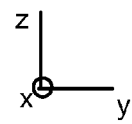
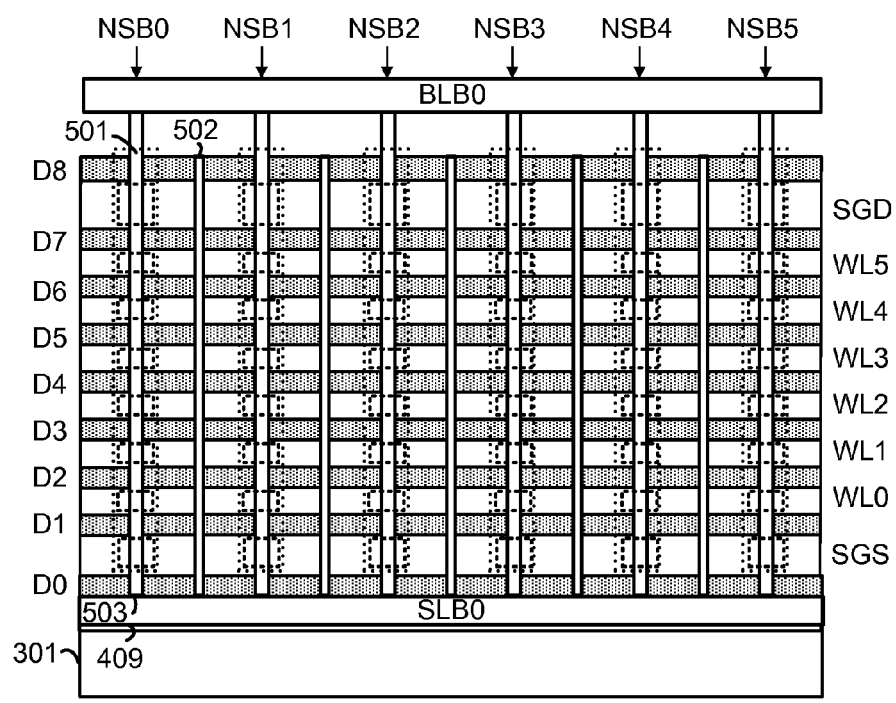
Fig. 5B

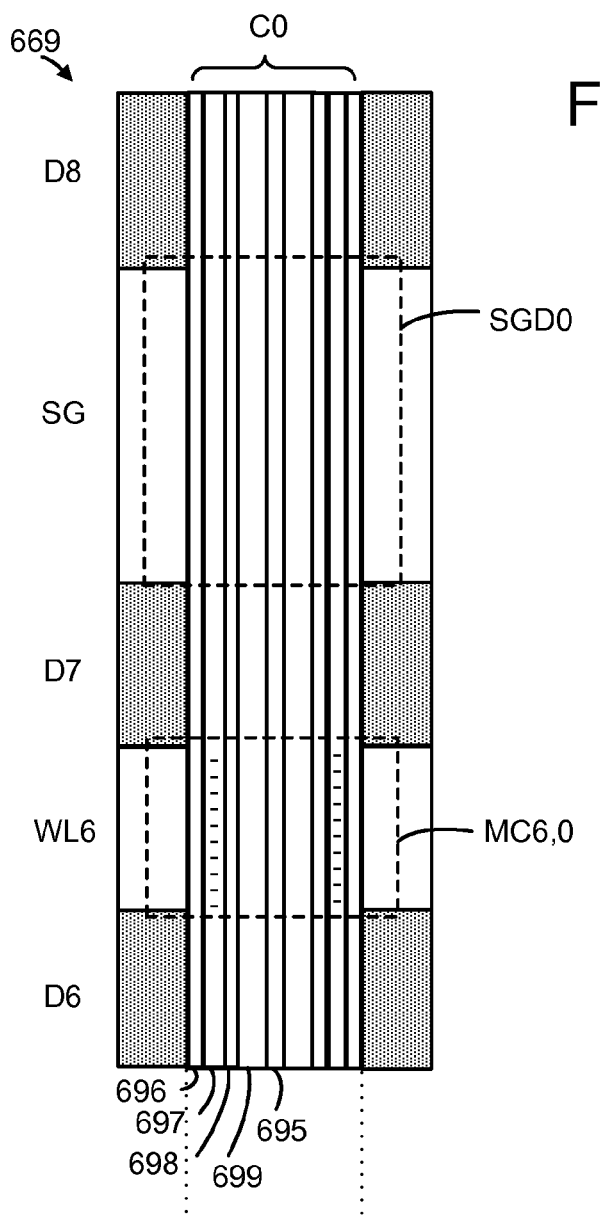
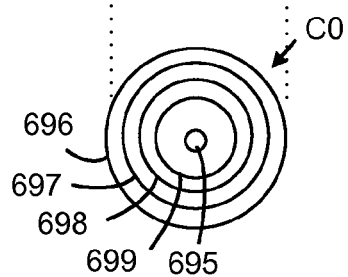
Fig. 6A
Fig. 6B

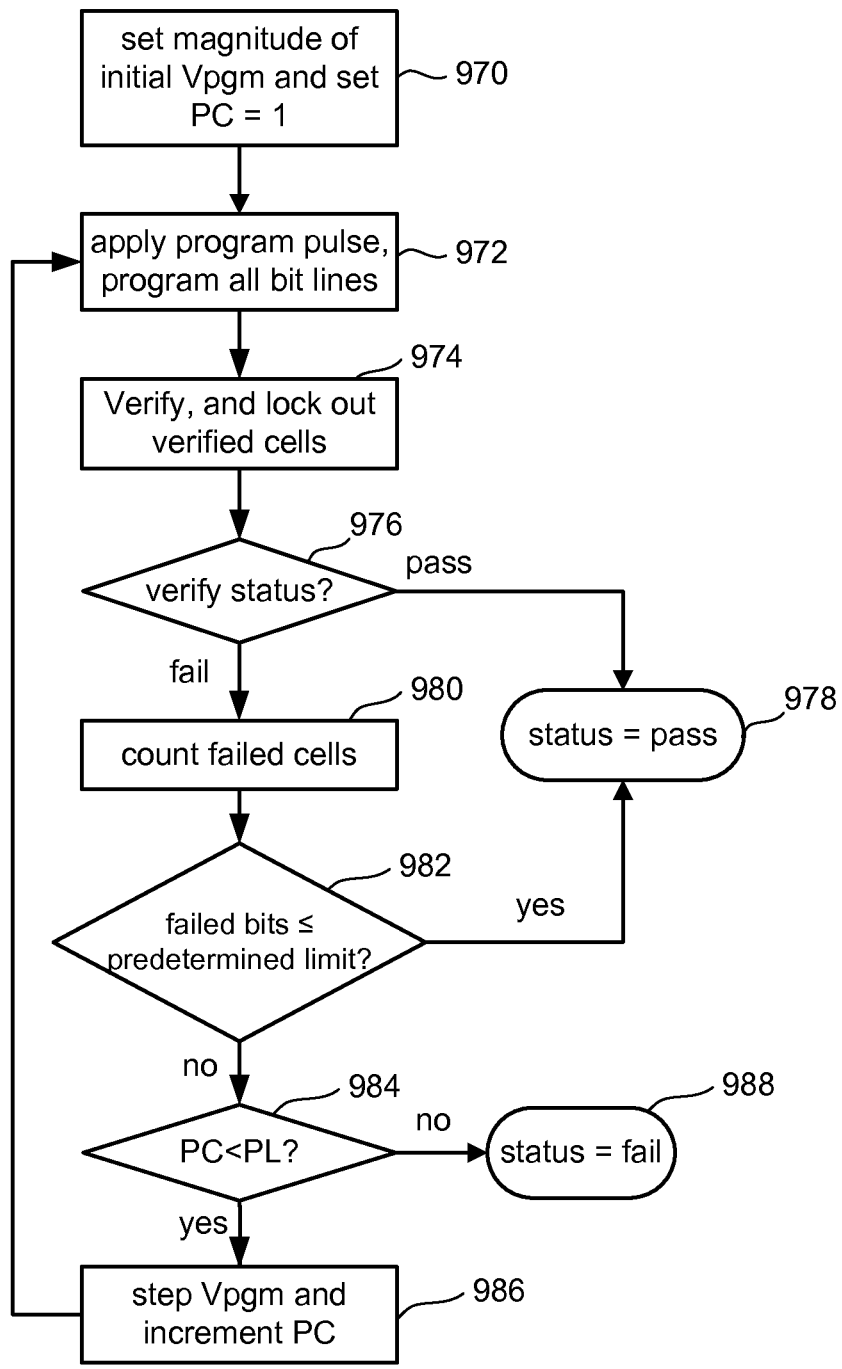

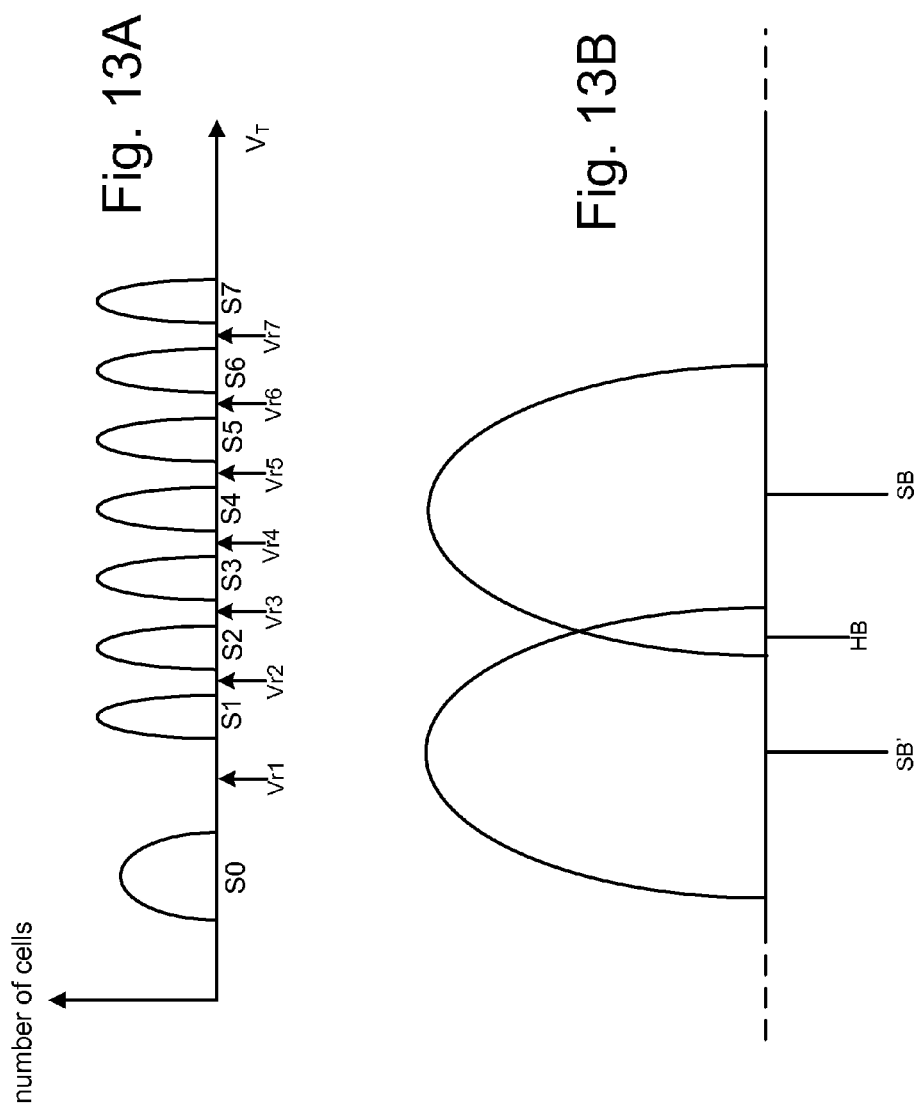

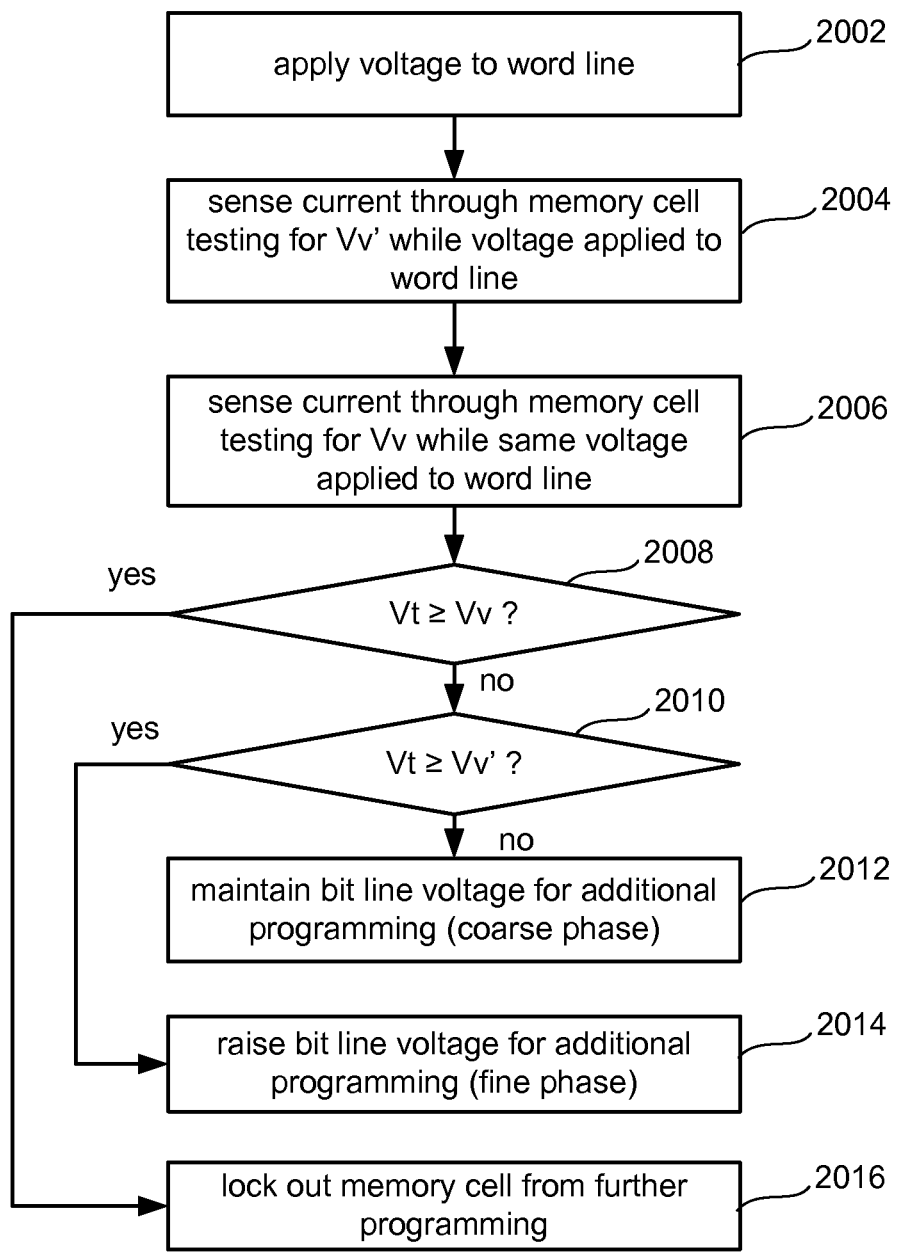

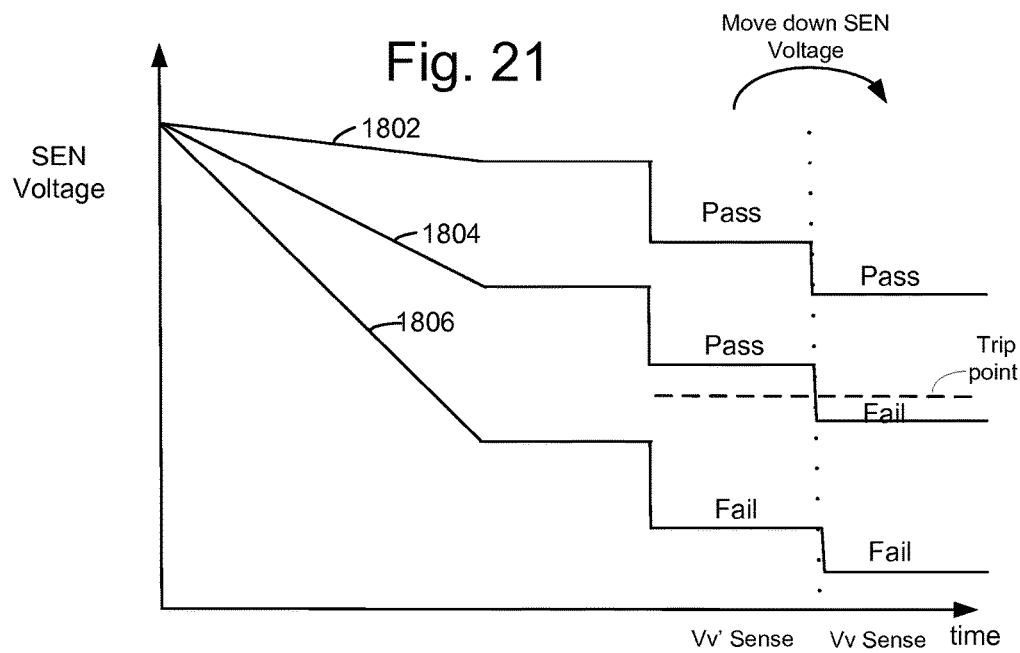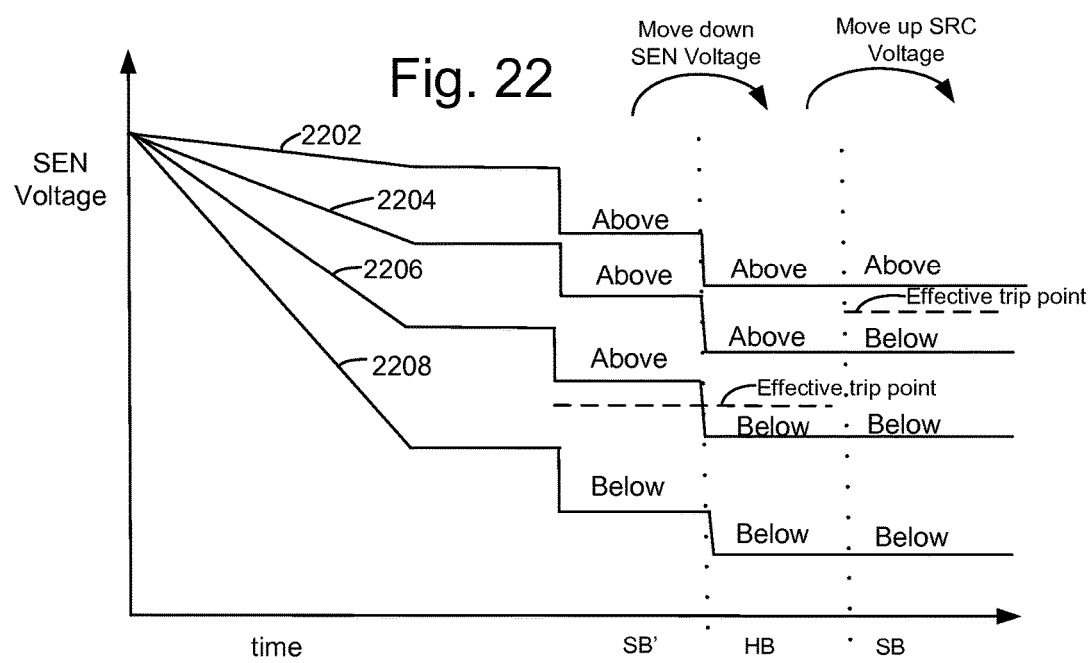

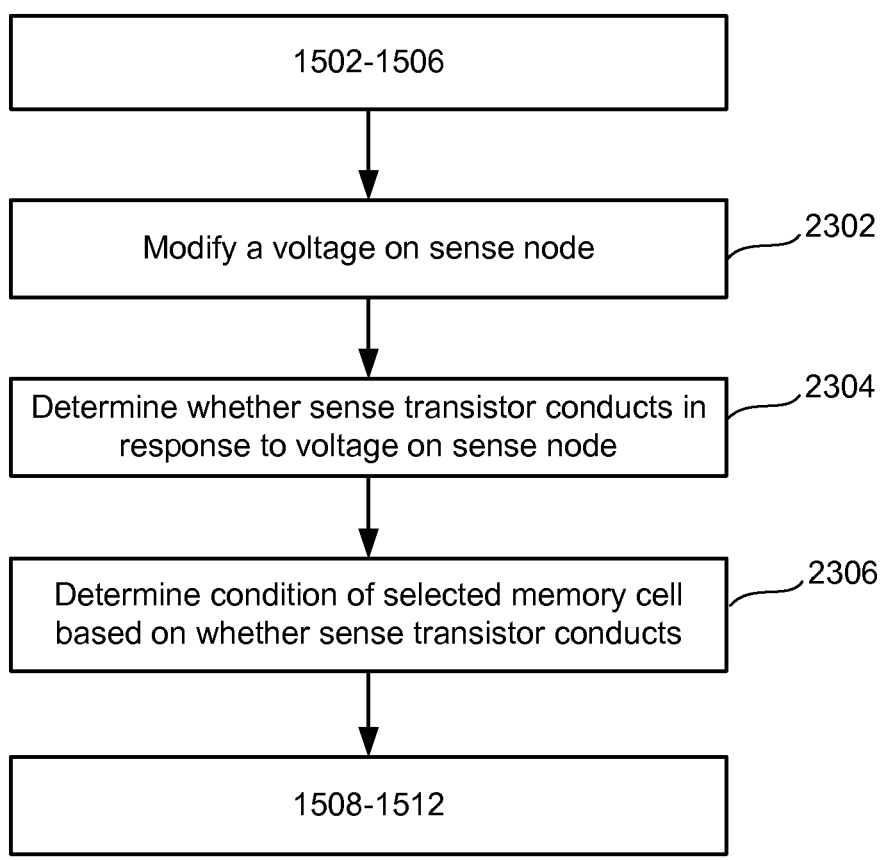

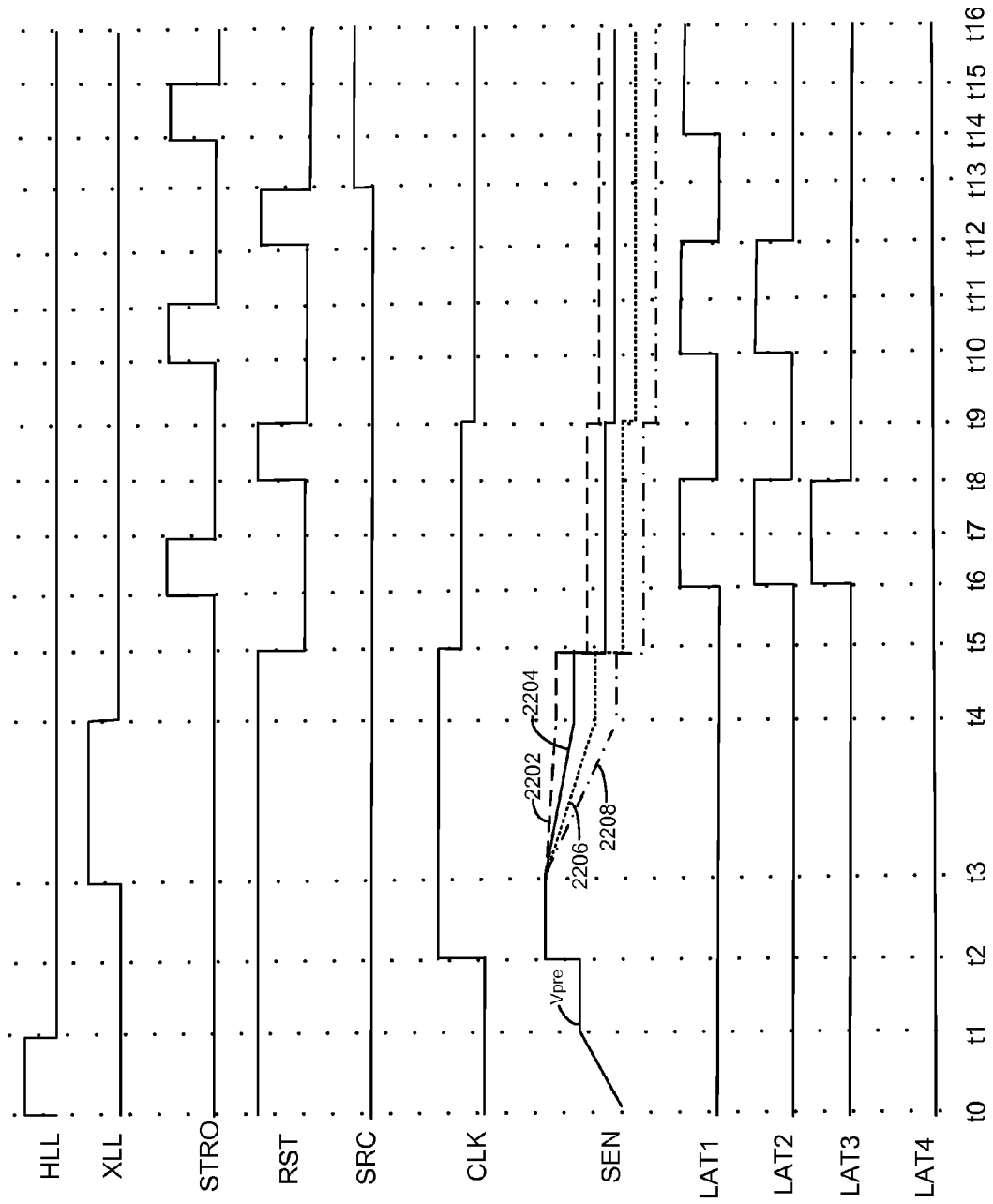

SENSING MULTIPLE REFERENCE LEVELS IN NON-VOLATILE STORAGE ELEMENTS

BACKGROUND

The present disclosure relates to technology for non-volatile storage.

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some EEPROMs or flash memory devices have a configuration referred to as a NAND configuration in which memory cells are grouped as NAND strings with each NAND string associated with a bit line. One type of NAND memory array is a two-dimensional array. Another type of NAND memory array is a three-dimensional array. One 3D NAND stacked memory device is sometimes referred to as a Bit Cost Scalable (BiCS) architecture.

In a 3D NAND BiCS architecture, a 3D NAND stacked memory device can be formed from an array of alternating conductor and insulator layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A dielectric and back gate may surround the pipe connection forming a back gate transistor to control conduction of the pipe connection. Control gates of the memory cells are provided by the conductor layers.

When programming an EEPROM or flash memory device, such as a NAND flash memory device, typically a program voltage is applied to the control gate (or selected word line) and the bit line is grounded. Electrons from the channel are injected into the charge storage region. When electrons accumulate in the charge storage region, the charge storage region becomes negatively charged and the threshold voltage of the memory cell is raised so that the memory cell is in a programmed state.

Typically, the program voltage (Vpgm) is applied to the control gates of the memory cells as a series of pulses. The magnitude of the pulses is increased with each successive pulse by a predetermined step size (e.g. 0.2v, 0.3v, 0.4v, or others). In the periods between the pulses, verify operations are carried out. That is, the programming level of each memory cell of a group of memory cells being programmed in parallel is sensed between each programming pulse to determine whether it is equal to or greater than a verify level to which it is being programmed. One means of verifying the programming is to test conduction at a specific compare point. The memory cells that are verified to be sufficiently programmed are locked out, for example, by raising their respective bit line voltage to stop the programming process for those memory cells.

DESCRIPTION OF THE DRAWINGS

FIG. 3 is a perspective view of a 3D stacked non-volatile memory device.

FIG. 5B depicts a cross-sectional view of a block of the 3D non-volatile memory device of FIG. 5A having straight strings.

FIG. 6A depicts a close-up view of the region 669 of the column C0 of FIG. 4B, showing a drain-side select gate SGD0 and a memory cell MC6,0.

FIG. 6B depicts a cross-sectional view of the column C0 of FIG. 6A.

FIG. 9A is a flow chart describing one embodiment of a process for programming.

FIG. 13A shows threshold distributions of memory cells just after programming is complete.

FIG. 13B depicts two neighboring threshold voltage distributions with reference levels for a hard bit (HB) and two associated soft bits (SB', SB).

FIG. 20 is one embodiment of a process of verifying memory cells during a programming operation.

FIG. 21 shows a diagram to one embodiment in which the trip point of the sense circuit is changed by increasing the voltage on the bottom plate of a sense capacitor.

FIG. 22 is a diagram of one embodiment that modifies voltage on a sense node and a source node of a sensing transistor to sense at multiple levels.

FIG. 23 is a flowchart of one embodiment of a process of reading a hard bit and two soft bits.

FIG. 24 contains timing signals for the circuit of FIG. 16 for one embodiment of the process of FIG. 23.

DETAILED DESCRIPTION

Disclosed herein are techniques for sensing multiple levels in non-volatile storage elements. Multiple levels can be sensed without changing the voltage on the selected word line. One embodiment includes determining a first condition of a selected non-volatile storage element with respect to a first reference level based on whether a sensing transistor conducts in response to a sense voltage on a sense node. Then, a voltage on the source terminal of the sensing transistor is modified after determining the first condition with respect to the first reference level. Then, a second condition of the selected non-volatile storage element is determined with respect to a second reference level based on whether the sensing transistor conducts in response to the sense voltage on the sense node after modifying the voltage on the source terminal of the sensing transistor. This allows two different reference levels to be sensed without changing the voltage on the selected word line. Also, dynamic power consumption is low due to low capacitance of the sensing transistor relative to the sense node. Embodiments can also improve sensing margin.

One example of a memory system suitable for implementing embodiments uses a NAND flash memory architecture, which includes connecting multiple transistors in series between two select gates. Note that this could be a 2D NAND architecture or a 3D NAND architecture. Some examples are described herein of a 2D NAND architecture. Other examples described herein are of a 3D NAND architecture. Techniques described herein can be applied to 2D NAND, 3D NAND, but are not limited thereto.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

Figure 1:
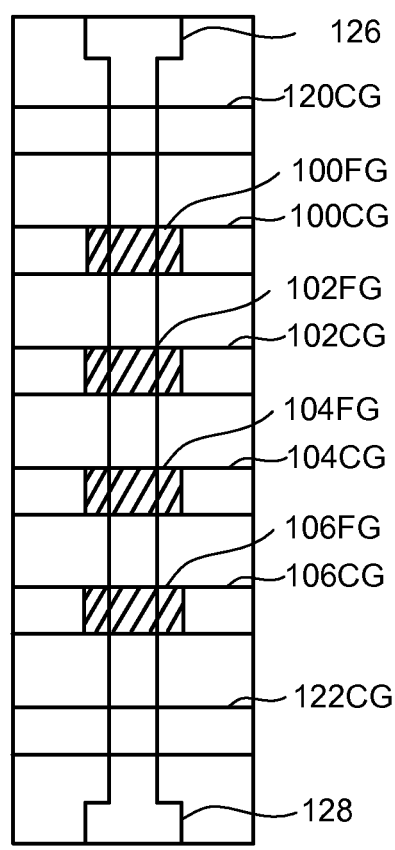
FIG. 1 is a top view of a NAND string.
Figure 2:
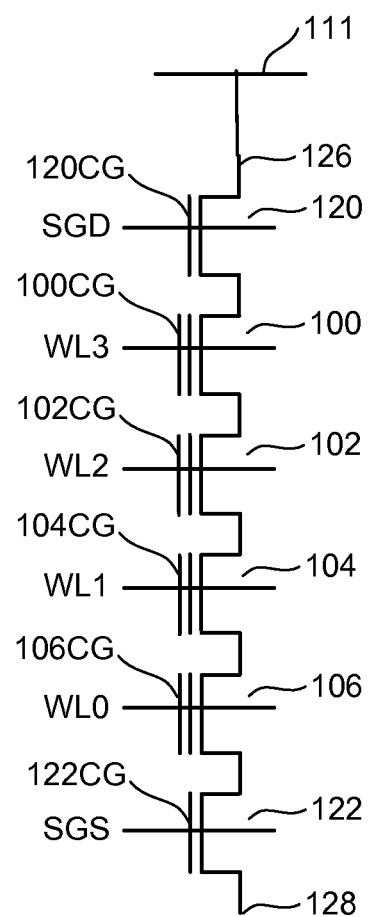
FIG. 2 is an equivalent circuit diagram of the NAND string.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between (drain side) select gate 120 and (source side) select gate 122. Select gate 120 connects the NAND string to a bit line 111 via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will have 128 memory cells or more. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Other types of non-volatile storage devices, in addition to NAND flash memory, can also be used to implement the new technology described herein. For example, a TANOS structure (consisting of a stacked layer of TaN—$Al_2O_3$—SiN—$SiO_2$ on a silicon substrate), which is basically a memory cell using trapping of charge in a nitride layer (instead of a floating gate), can also be used with the technology described herein. Another type of memory cell useful in flash EEPROM systems utilizes a non-conductive dielectric material in place of a conductive floating gate to store charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Another example is described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Other types of non-volatile memory technologies can also be used.

The following discussion of an example 3D memory device is presented as one possible architecture in which embodiments may be practiced. These examples include a 3D NAND memory device. That is, the device includes NAND strings. These strings may be similar to those depicted in FIGS. 1-2, although note that a floating gate is not necessarily used in a 3D memory device. As will be discussed below, memory cells have a charge trapping region in one embodiment of a 3D NAND memory device.

The following discussion of an example 3D memory device is presented as one possible architecture in which embodiments may be practiced. These examples include a 3D NAND memory device. That is, the device includes NAND strings. These strings may be similar to those depicted in FIGS. 1-2, although note that a floating gate is not necessarily used in a 3D memory device. As will be discussed below, memory cells have a charge trapping region in one embodiment of a 3D NAND memory device.

FIG. 3 is a perspective view of a 3D stacked non-volatile memory device. The 3D memory device 300 includes a substrate 301. In one embodiment, the substrate 301 is formed from silicon. On the substrate are example blocks BLK0 and BLK1 of memory cells and a peripheral area 406 with circuitry for use by the blocks. The substrate 301 can also carry circuitry under the blocks, along with one or more lower metal layers which are patterned in conductive paths to carry signals of the circuitry. The blocks are formed in an intermediate region 302 of the memory device. The circuitry associated with operation of the memory cells may be above or within the substrate 301. In one embodiment, the non-volatile memory device is monolithically formed in one or more physical levels of arrays of memory cells having an active area disposed above the substrate 301.

In an upper region 303 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 4A:
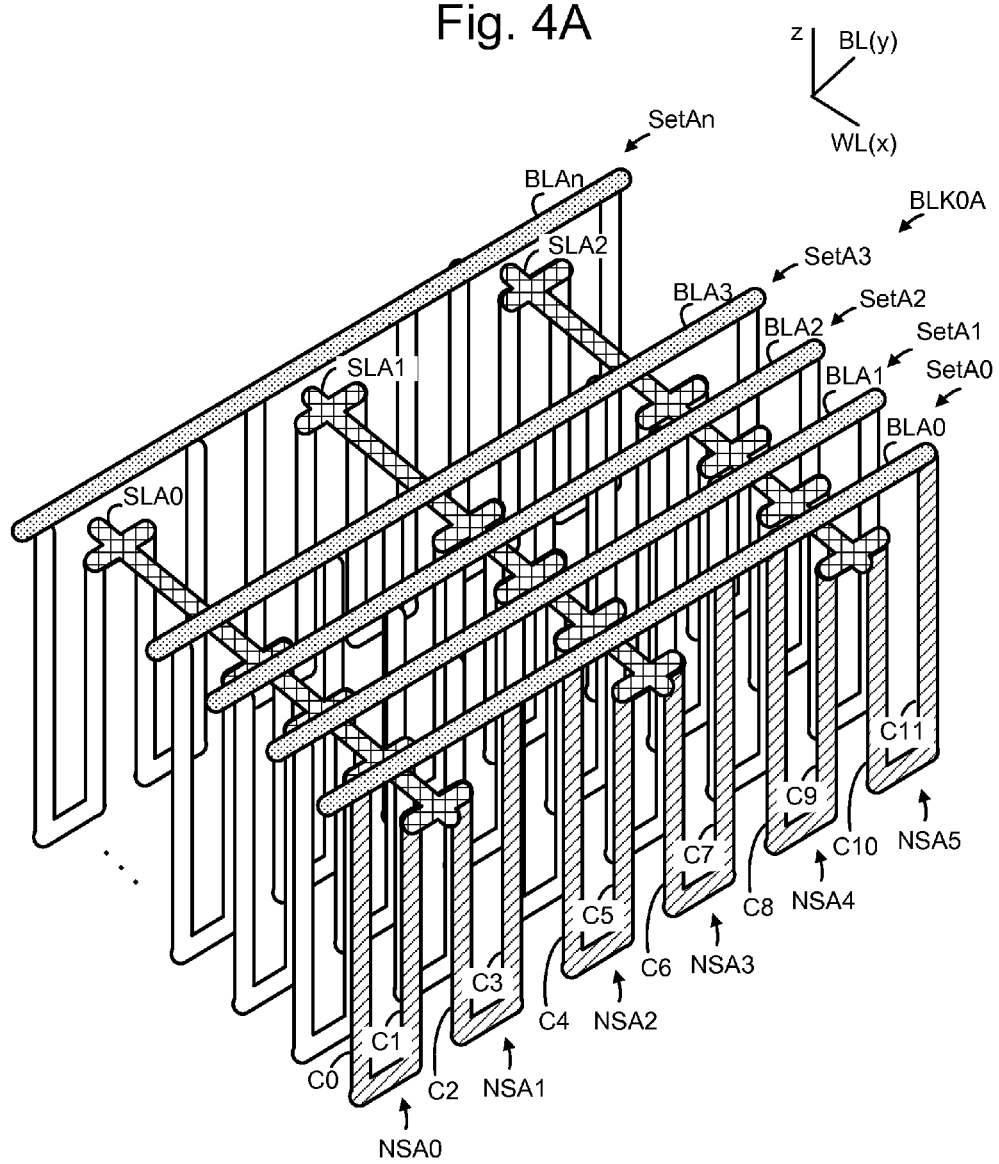
FIG. 4A depicts an embodiment of block BLK0 of FIG. 3 which includes U-shaped NAND strings.

In one embodiment, NAND strings have a U-shape. In another embodiment, NAND strings have a straight shape. FIG. 4A depicts an embodiment of block BLK0 of FIG. 3 which includes U-shaped NAND strings. The block BLK0A includes U-shaped NAND strings arranged in sets (SetA0, . . . , SetAn, where there are n−1 sets of NAND strings in a block). Each set of NAND strings is associated with one bit line (BLA0, BLA1, BLA2, BLA3, BLAn). In one embodiment, each NAND string has a drain side select gate that is able to connect/disconnect the NAND string from its bit line. The drain side select gates in a set of NAND strings may be individually selectable, such that one NAND string in the set may be selected at a given time. In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

Figure 4B:
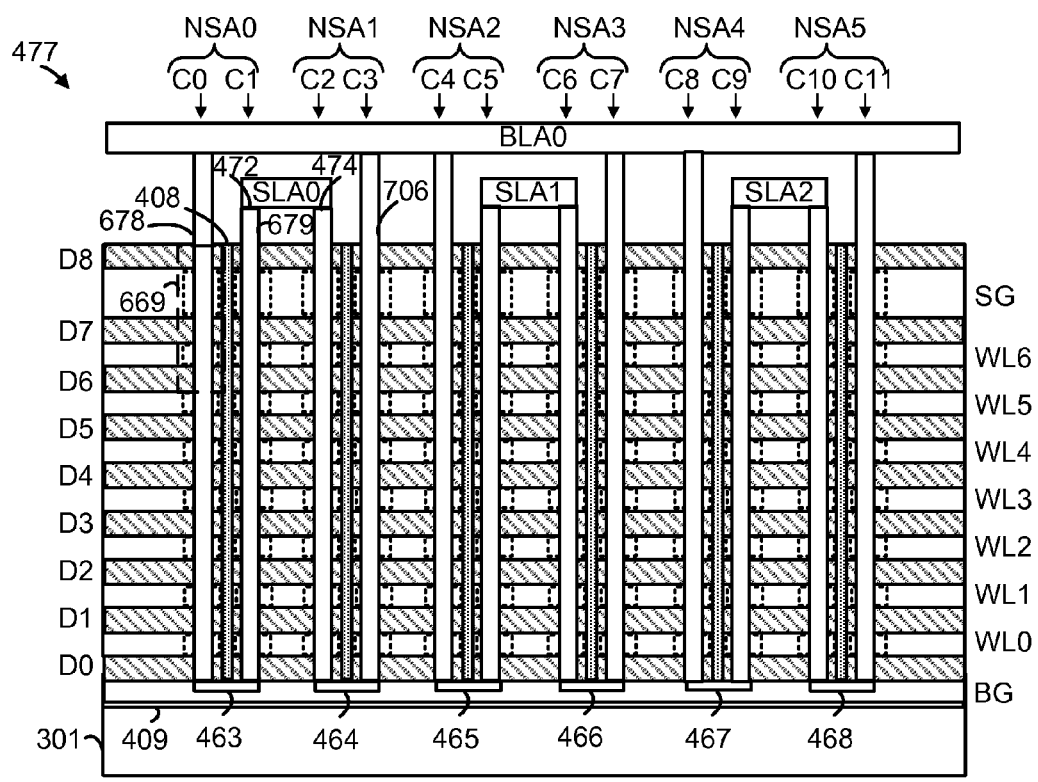
FIG. 4B depicts a cross-sectional view of a block of the 3D non-volatile memory device of FIG. 4A of SetA0 of NAND strings of FIG. 4A.

FIG. 4B depicts a cross-sectional view of a block of the 3D non-volatile memory device of FIG. 4A of SetA0 of NAND strings of FIG. 4A. Columns of memory cells C0 to C11 are depicted in the multi-layer stack. The stack 477 includes the substrate 301, an insulating film 409 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 463 to 468 which connect the columns. The back gate thus connects the two columns of each U-shaped NAND string. For example, NSA0 includes columns C0 and C1 and connecting portion 463. NSA0 as a drain end 678 and a source end 472. NSA1 includes columns C2 and C3 and connecting portion 464. NSA1 has a drain end 706 and a source end 474. NSA2 includes columns C4 and C5 and connecting portion 665. NSA3 includes columns C6 and C7 and connecting portion 466. NSA4 includes columns C8 and C9 and connecting portion 467. NSA5 includes columns C10 and C11 and connecting portion 468.

The source line SLA0 is connected to the source ends 472 and 474 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 477 extend behind the U-shaped NAND strings depicted in the cross-section, e.g., along the x-axis. The U-shaped NAND strings NSA0 to NSA5 are each in a different sub-block, but are in a common set of NAND strings (SetA0).

A slit portion 408 is also depicted as an example. In the cross-section, multiple slit portions are seen, where each slit portion is between the drain- and source-side columns of a U-shaped NAND string. Portions of the source lines SLA0, SLA1, SLA2 are also depicted. A portion of the bit line BLA0 is also depicted.

Short dashed lines depict memory cells and select gates, as discussed further below. Thus, FIG. 4B shows a strings (e.g., NAND strings) of non-volatile storage elements formed above the substrate 301 in multiple physical levels of a three-dimensional memory array. Each of the strings has an active area comprising a channel that extends vertically through the physical levels. Each string comprises non-volatile storage elements and a drain side select gate in the SG layer.

Figure 5A:
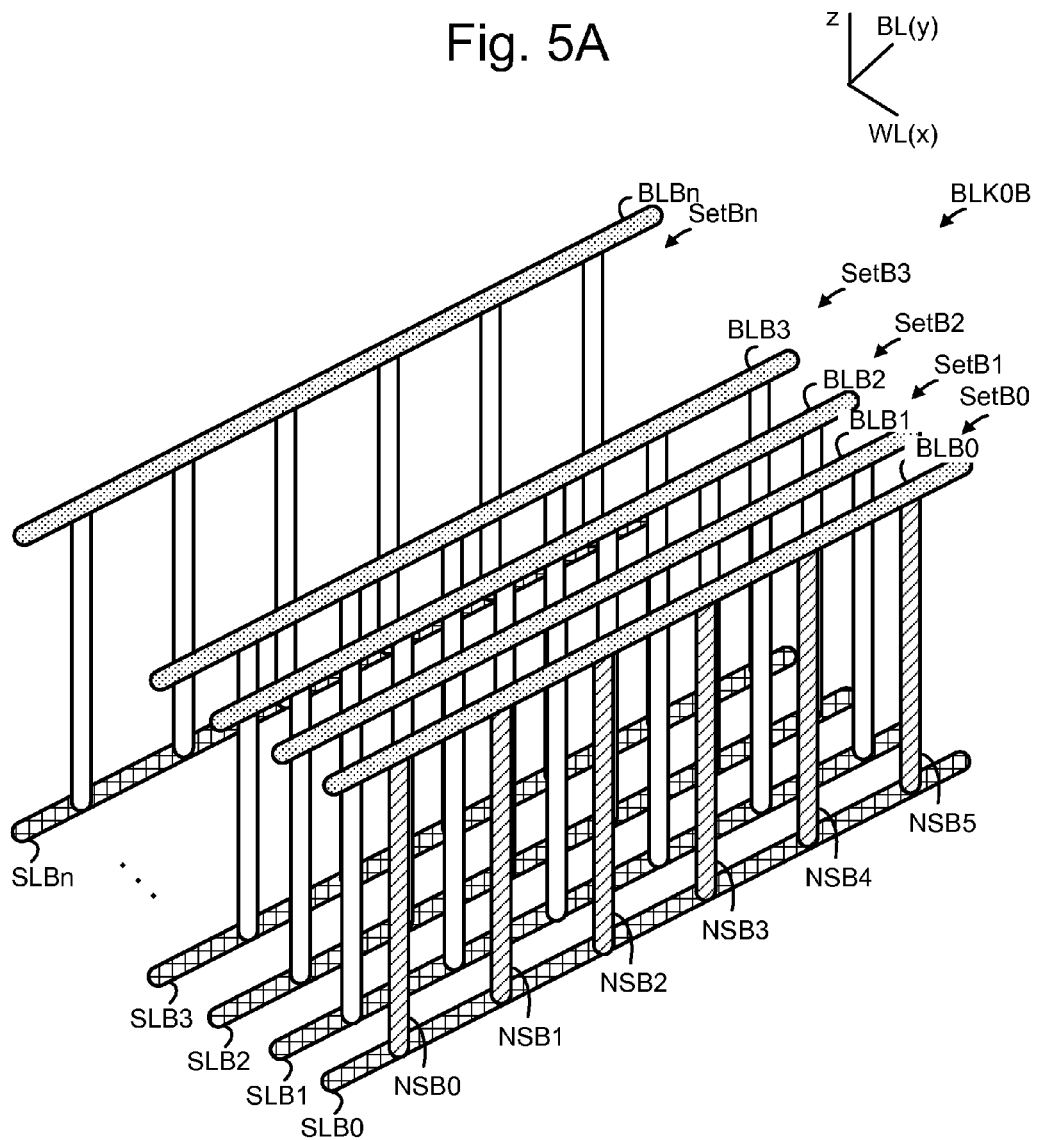
FIG. 5A depicts an embodiment of block BLK0 of FIG. 3 which includes straight NAND strings.

FIG. 5A depicts an embodiment of block BLK0 of FIG. 3 which includes straight NAND strings. The block BLK0B includes straight NAND strings arranged in sets (SetB0, SetB1, SetB2, SetB3, . . . , SetBn, where there are n−1 sets in a block). Each set of NAND strings is associated with one bit line (BLB0, BLB1, BLB2, BLB3, BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

FIG. 5B depicts a cross-sectional view of a block of the 3D non-volatile memory device of FIG. 5A having straight strings. The view of a portion of setB0 of NAND strings of FIG. 5A. Columns of memory cells corresponding to NAND strings NSB0 to NSB5, respectively, are depicted in the multi-layer stack. The stack 577 includes a substrate 301, an insulating film 409 on the substrate, and a portion of a source line SLB1. Recall that the additional straight NAND strings in a sub-block extend in front of and in back of the NAND strings depicted in the cross-section, e.g., along the x-axis. The NAND strings NSB0 to NSB5 are each in a different sub-block, but are in a common set of NAND strings (SetB0). NSB0 has a source end 503 and a drain end 501. A slit 502 is also depicted with other slits. A portion of the bit line BLB0 is also depicted. Dashed lines depict memory cells and select gates, as discussed further below.

A region 669 of the stack is shown in greater detail in FIG. 6A. FIG. 6A depicts a close-up view of the region 669 of the column C0 of FIG. 4B, showing a drain-side select gate SGD0 and a memory cell MC6,0. FIG. 6B depicts a cross-sectional view of the column C0 of FIG. 6A. Each layer is ring-shaped in one possible approach, except the core filler which is cylindrical. Recall that region 669 of the column C0 of FIG. 4B is for the U-shaped 3D NAND string example. However, the diagrams and discussion for FIGS. 6A and 6B also apply to a straight 3D NAND string.

The region 669 shows portions of the dielectric layers D6 to D8 and the conductive layers WL6 and SG. Each column includes a number of layers which are deposited along the sidewalls of the column. These layers can include oxide-nitride-oxide and polysilicon layers which are deposited, e.g., using atomic layer deposition. For example, a block oxide can be deposited as layer 696, a nitride such as SiN as a charge trapping layer can be deposited as layer 697, a tunnel oxide can be deposited as layer 698, a polysilicon body or channel can be deposited as layer 699, and a core filler dielectric can be deposited as region 695. The polysilicon body or channel 699 may also be referred to as an active area. Additional memory cells are similarly formed throughout the columns.

When such a memory cell is programmed, electrons are stored in a portion of the charge trapping layer which is associated with the memory cell. For example, electrons are represented by "−" symbols in the charge trapping layer 697 for MC6,0. These electrons are drawn into the charge trapping layer from the polysilicon body, and through the tunnel oxide. The threshold voltage of a memory cell is increased in proportion to the amount of stored charge.

Figure 7:
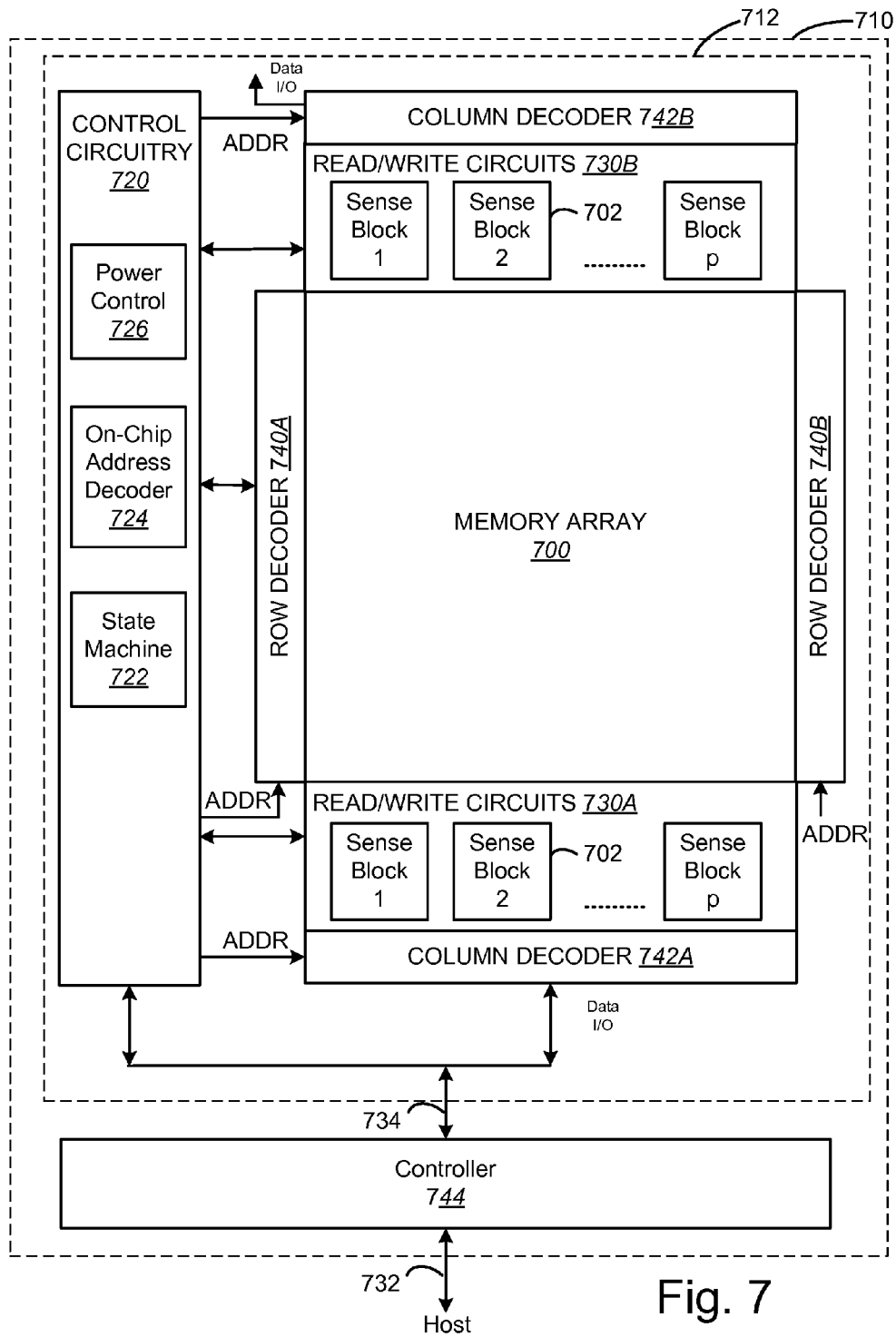
FIG. 7 is a block diagram of a non-volatile memory system.

FIG. 7 illustrates a memory device 710 having read/write circuits for reading and programming a page of memory cells (e.g., NAND multi-state flash memory) in parallel. Memory device 710 may include one or more memory die or chips 712. Memory die 712 includes an array (two-dimensional or three dimensional) of memory cells 700, control circuitry 720, and read/write circuits 730A and 730B. In one embodiment, access to the memory array 700 by the various peripheral circuits is implemented in a symmetric fashion, on opposite sides of the array, so that the densities of access lines and circuitry on each side are reduced by half. The read/write circuits 730A and 730B include multiple sense blocks 702 which allow a page of memory cells to be read or programmed in parallel. The memory array 700 is addressable by word lines via row decoders 740A and 740B and by bit lines via column decoders 742A and 742B. In a typical embodiment, a controller 744 is included in the same memory device 710 (e.g., a removable storage card or package) as the one or more memory die 712. Commands and data are transferred between the host and controller 744 via lines 732 and between the controller and the one or more memory die 712 via lines 734. Some memory systems may include multiple dies 712 in communication with Controller 744.

Control circuitry 720 cooperates with the read/write circuits 730A and 730B to perform memory operations on the memory array 700. The control circuitry 720 includes a state machine 722, an on-chip address decoder 724 and a power control module 726. The state machine 722 provides chip-level control of memory operations. The on-chip address decoder 724 provides an address interface between that used by the host or a memory controller to the hardware address used by the decoders 740A, 740B, 742A, and 742B. The power control module 726 controls the power and voltages supplied to the word lines and bit lines during memory operations. In one embodiment, power control module 726 includes one or more charge pumps that can create voltages larger than the supply voltage. Control circuitry 720, power control 726, decoder 724, state machine 722, decoders 740 A/B & 742A/B, the read/write circuits 730A/B and the controller 744, collectively or separately, can be referred to as one or more managing circuits (or as "managing circuitry").

Figure 8:
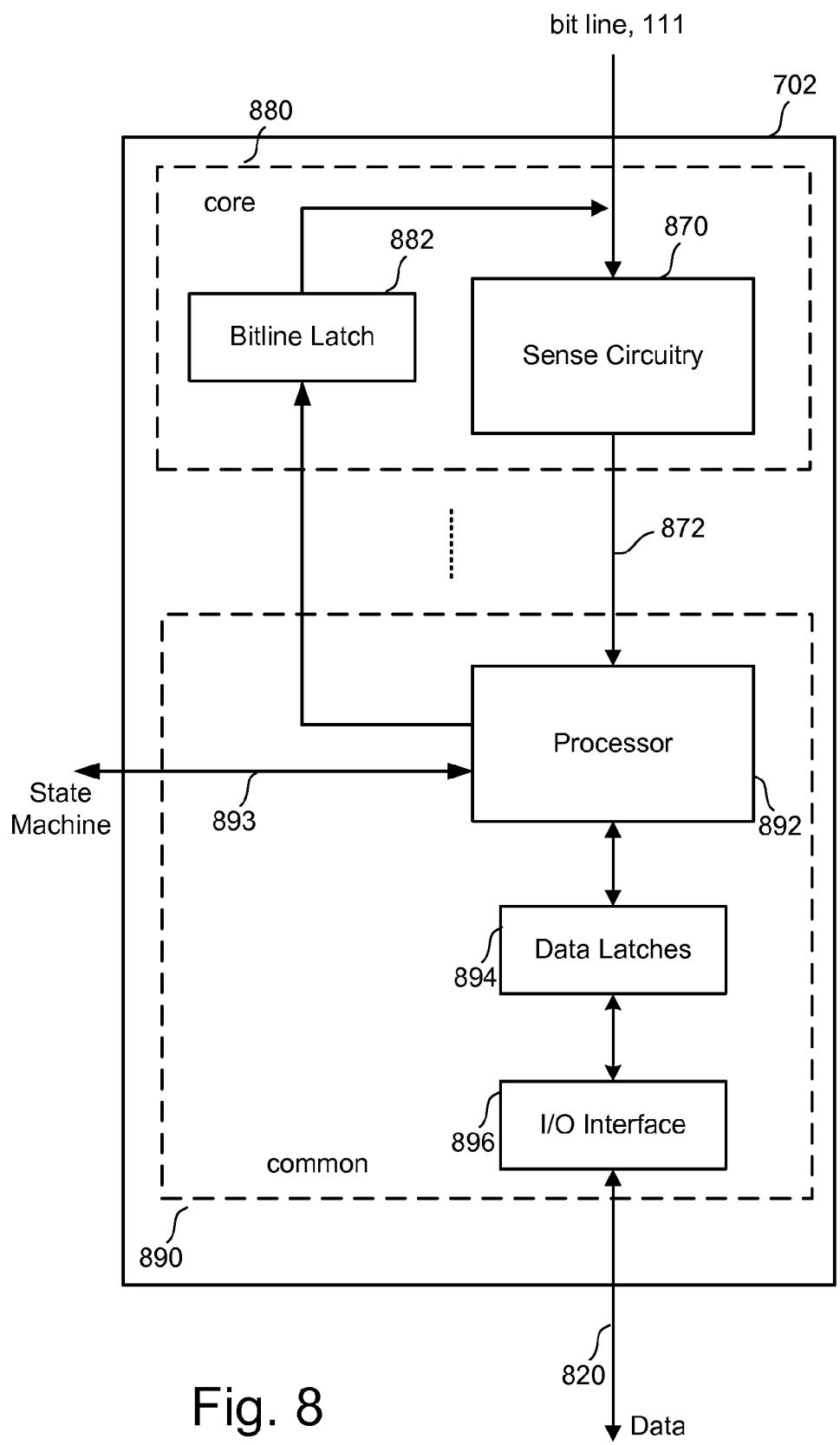
FIG. 8 is a block diagram of an individual sense block/

FIG. 8 is a block diagram of an individual sense block 702 partitioned into a core portion, referred to as a sense module 880, and a common portion 890. In one embodiment, there will be a separate sense module 880 for each bit line and one common portion 890 for a set of multiple sense modules 880. In one example, a sense block will include one common portion 890 and eight sense modules 880. Each of the sense modules in a group will communicate with the associated common portion via a data bus 872.

Sense module 880 comprises sense circuitry 870 that determines whether a conduction current in a connected bit line 111 is above or below a predetermined level. In some embodiments, sense module 880 includes a circuit commonly referred to as a sense amplifier. Sense module 880 also includes a bit line latch 882 that is used to set a voltage condition on the connected bit line 111. For example, a predetermined state latched in bit line latch 882 will result in the connected bit line being pulled to a state designating program inhibit (e.g., Vdd).

Common portion 890 comprises a processor 892, a set of data latches 894 and an I/O Interface 896 coupled between the set of data latches 894 and data bus 820. Processor 892 performs computations. For example, one of its functions is to determine the data stored in the sensed memory cell and store the determined data in the set of data latches. The set of data latches 894 is used to store data bits determined by processor 892 during a read operation. It is also used to store data bits imported from the data bus 820 during a program operation. The imported data bits represent write data meant to be programmed into the memory. I/O interface 896 provides an interface between data latches 894 and the data bus 820.

During read or sensing, the operation of the system is under the control of state machine 722 that controls the supply of different control gate voltages to the addressed cell. As it steps through the various predefined control gate voltages (e.g., the read reference voltages or the verify reference voltages) corresponding to the various memory states supported by the memory, the sense module 880 may trip at one of these voltages and an output will be provided from sense module 880 to processor 892 via bus 872. At that point, processor 892 determines the resultant memory state by consideration of the tripping event(s) of the sense module and the information about the applied control gate voltage from the state machine via input lines 893. It then computes a binary encoding for the memory state and stores the resultant data bits into data latches 894. In another embodiment of the core portion, bit line latch 882 serves double duty, both as a latch for latching the output of the sense module 880 and also as a bit line latch as described above.

It is anticipated that some implementations will include multiple processors 892. In one embodiment, each processor 892 will include an output line (not depicted in FIG. 8) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 892 to accumulate the results of the associated bit lines such that the state machine need only read the wired-OR line one time. In some embodiments that have many sense modules, the wired-OR lines of the many sense modules can be grouped in sets of N sense modules, and the groups can then be grouped to form a binary tree.

During program or verify, the data to be programmed is stored in the set of data latches 894 from the data bus 820. The program operation, under the control of the state machine, comprises a series of programming voltage pulses (with increasing magnitudes) concurrently applied to the control gates of the addressed memory cells to that the memory cells are programmed at the same time. Each programming pulse is followed by a verify process to determine if the memory cell has been programmed to the desired state. Processor 892 monitors the verified memory state relative to the desired memory state. When the two are in agreement, processor 892 sets the bit line latch 882 so as to cause the bit line to be pulled to a state designating program inhibit. This inhibits the memory cell coupled to the bit line 111 from further programming even if it is subjected to programming pulses on its control gate. In other embodiments the processor initially loads the bit line latch 882 and the sense circuitry sets it to an inhibit value during the verify process.

Data latch stack 894 contains a stack of data latches corresponding to the sense module. In one embodiment, there are three (or four or another number) data latches per sense module 880. In some implementations (but not required), the data latches are implemented as a shift register so that the parallel data stored therein is converted to serial data for data bus 820, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data into or out of the data bus in sequence as if they are part of a shift register for the entire read/write block.

Figure 9B:
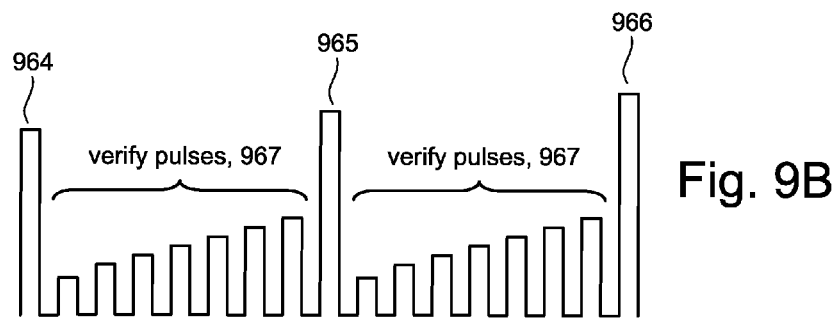
FIG. 9B shows one example sequence of program pulses and verify pulses.

FIG. 9A is a flow chart describing one embodiment of a process for performing programming on memory cells connected to a common word line to one or more targets (e.g., data states or threshold voltage ranges). Typically, the program voltage applied to the control gate during a program operation is applied as a series of program pulses. Between programming pulses are a set of verify pulses to perform verification. In many implementations, the magnitude of the program pulses is increased with each successive pulse by a predetermined step size. FIG. 9B shows one example sequence of program pulses 964, 965, 966 and verify pulses 967.

In step 570 of FIG. 9A, the programming voltage (Vpgm) is initialized to the starting magnitude (e.g., ~12-16V or another suitable level) and a program counter PC maintained by state machine 722 is initialized at 1. In step 972, a program pulse of the program signal Vpgm is applied to the selected word line (the word line selected for programming). In one embodiment, the group of memory cells being programmed concurrently are all connected to the same word line (the selected word line). The unselected word lines may receive one or more boosting voltages (e.g., ~7-11 volts) to perform boosting schemes known in the art. If a memory cell should be programmed, then the corresponding bit line is grounded, in one embodiment. On the other hand, if the memory cell should remain at its current threshold voltage, then the corresponding bit line may be connected to Vdd to inhibit programming. In step 972, the program pulse is concurrently applied to all memory cells connected to the selected word line so that all of the memory cells connected to the selected word line are programmed concurrently. That is, they are programmed at the same time (or during overlapping times). In this manner all of the memory cells connected to the selected word line will concurrently have their threshold voltage change, unless they have been locked out from programming.

In step 974, the appropriate memory cells are verified using the appropriate set of target levels to perform one or more verify operations. In one embodiment, the verification process is performed by testing whether the threshold voltages of the memory cells selected for programming have reached the appropriate verify compare voltage. Referring to FIG. 9B, there may be several verify pulses 967 between each program pulse to test for different program states. This will be discussed further with respect to FIGS. 10A-E. In some embodiments, multiple verify levels are tested for while applying the same voltage to the selected word line. Further details are discussed below.

In step 976, it is determined whether all the memory cells have reached their target threshold voltages (pass). If so, the programming process is complete and successful because all selected memory cells were programmed and verified to their target states. A status of "PASS" is reported in step 978. If, in 976, it is determined that not all of the memory cells have reached their target threshold voltages (fail), then the programming process continues to step 980. Note that in some embodiments, there is a verify low reference level and a verify high reference level. This will be discussed below in connection with, for example, the process of FIG. 20.

In step 980, the system counts the number of memory cells that have not yet reached their respective target threshold voltage. That is, the system counts the number of cells that have failed the verify process. This counting can be done by the state machine, the controller, or other logic. In one implementation, each of the sense blocks 702 (see FIG. 7) will store the status (pass/fail) of their respective cells. These values can be counted using a digital counter. As described above, many of the sense blocks have an output signal that is wire-OR'd together. Thus, checking one line can indicate that no cells of a large group of cells have failed verify. By appropriately organizing the lines being wired-OR together (e.g., a binary tree-like structure), a binary search method can be used to determine the number of cells that have failed. In such a manner, if a small number of cells failed, the counting is completed rapidly. If a large number of cells failed, the counting takes a longer time. In another alternative, each of the sense amplifiers can output an analog voltage or current if its corresponding memory cell has failed and an analog voltage or current summing circuit can be used to count the number of memory cells that have failed.

In one embodiment, there is one total count, which reflects the total number of memory cells currently being programmed that have failed the last verify step. In another embodiment, separate counts are kept for each data state.

In step 982, it is determined whether the count from step 980 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 978. In this situation, enough memory cells programmed correctly such that the few remaining memory cells that have not been completely programmed can be corrected using ECC during the read process. In some embodiments, step 980 will count the number of failed cells for each sector, each target data state or other unit, and those counts will individually or collectively be compared to a threshold in step 582.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 984 and the program counter PC is checked against the program limit value (PL). Examples of program limit values include 20 and 30; however, other values can be used. If the program counter PC is not less than the program limit value PL, then the program process is considered to have failed and a status of FAIL is reported in step 988. If the program counter PC is less than the program limit value PL, then the process continues at step 586 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 986, the process loops back to step 972 and another program pulse is applied to the selected word line.

Figure 10A:
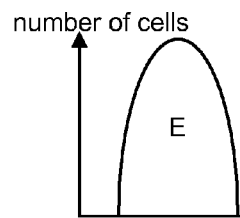
FIGS. 10A-E illustrates a multi-phase programming approach that may be used during one embodiment of the programming process of FIG. 9A.
Figure 10B:
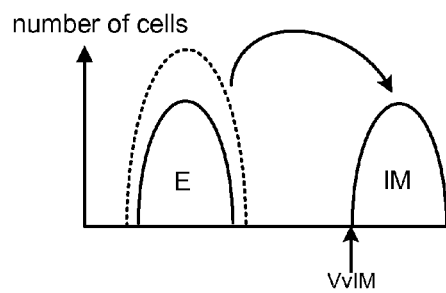
Figure 10C:
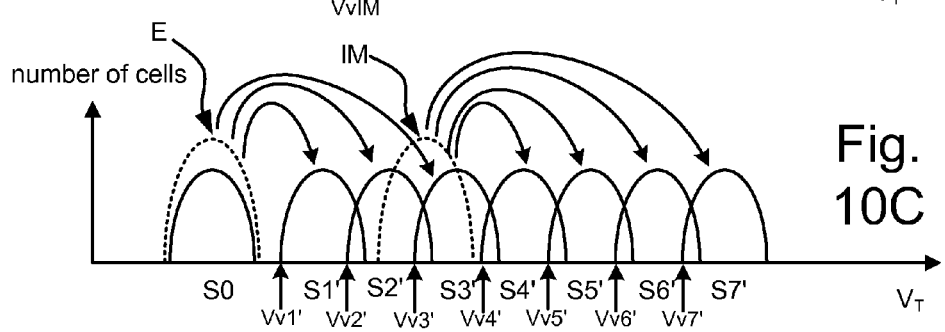
Figure 10D:
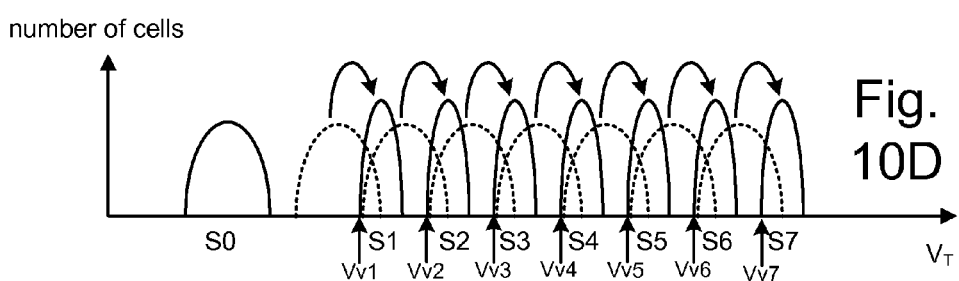
Figure 10E:
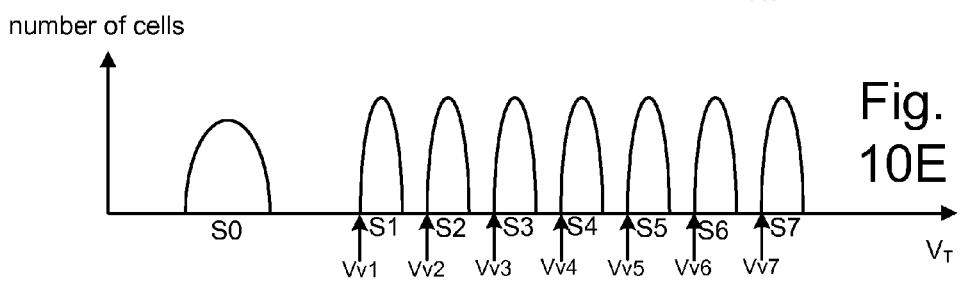

FIGS. 10A-E illustrate a multi-phase programming approach that may be used during one embodiment of the programming process of FIG. 9A. The final program states (S0-S7) are depicted in FIG. 10E. Note that there is a verify level (Vv1, Vv2, Vv3, Vv4, Vv5, Vv6, Vv7) associated with states S1-S7. These verify levels may correspond to the verify pulses in FIG. 9B.

In the embodiment of FIG. 10A-E, the programming process includes three phases. Prior to programming, the memory cells are erased so that all memory cells connected to a common word line are in an erased threshold voltage distribution E, as depicted in FIG. 10A. This common word line that is associated with memory cells to be programmed is referred to as a selected word line. Note that memory cells other than those associated with the selected word line may be erased together. For example, all memory cells in a block, or some section of the block, could be erased together.

During the first phase of programming, those memory cells whose targets (due to the data to be stored in those memory cells) are data states S4, S5, S6 or S7 are programmed to an intermediate state IM. Those memory cells that are targeted for data states S0, S1, S2 or S3 and remain in the erased threshold voltage distribution E. The first phase is graphically depicted by FIG. 10B. Memory cells being programmed to intermediate state IM are programmed to a target threshold voltage of VvIM.

During the second phase of the programming process of FIGS. 10A-E, memory cells are programmed to a verify level that is somewhat below their final intended verify level. This is depicted in FIG. 10C in which verify levels Vv1', Vv2', Vv3', Vv4', Vv5', Vv6', Vv7') associated with each state. The distributions are labeled, S1', S2', S3', S4', S5', S6', and S7' to indicate that these are not the final program states. These may be referred to a "foggy states". Note that, for example, Vv1' is lower than Vv1. It is not required that there be a lower verify level for each state. For example, there might not be a lower verify level Vv7' for the highest state. Instead memory cells for the highest state might be programmed directly to the higher verify level Vv7. The second phase may also be referred to as a course programming phase.

During the third phase of the programming process of FIGS. 10A-E, memory cells are programmed to their final program state. This is depicted in FIG. 10D in which verify levels Vv1, Vv2, Vv3, Vv4, Vv5, Vv6, Vv7 are associated with each state. During the third phase, the programming speed may be slowed down, which can help to create a tighter threshold voltage distribution. The third phase may be referred to as a fine programming phase. Note that the second phase and third phase may be performed together. Further details are discussed below.

During the second phase, memory cells that are in the erased threshold voltage distribution E are programmed to one of levels Vv1', Vv2', Vv3' or Vv4'. For example, those memory cells to be programmed to data state S3 are programmed from erased threshold voltage distribution E to foggy state S3', those memory cells to be programmed to data state S2 are programmed from erased threshold voltage distribution E to foggy state S2', those memory cells to be programmed to data state S1 are programmed from erase threshold voltage distribution E to foggy state S1', and those memory cells to be in data state S0 are not programmed during the second phase of the programming process. Thus, erased threshold voltage distribution E becomes data state S0. Also, during the second phase, memory cells are programmed from the intermediate state IM to various data states S4-S7. For example, those memory cells to be programmed to data state S7 are programmed from the intermediate state IM to foggy state S7', those memory cells targeted to be in data state S6 are programmed from intermediate state IM to foggy state S6', both memory cells to be programmed to data state S5 are programmed from intermediate state IM to foggy state S5', and those memory cells to be programmed to state S4 are programmed from intermediate state IM to foggy state S4'. This second phase of programming is illustrated in FIG. 10C.

As can be seen in FIG. 10C, at the end of the second phase of programming foggy states S1'-S7' overlap with neighboring foggy states. For example, foggy state S1' overlaps with foggy state S2', foggy state S2' overlaps with foggy states S1' and S3', foggy state S3' overlaps with foggy states S2' and S4', foggy state S4' overlaps with foggy states S3' and S5', foggy state S5' overlaps with foggy states S4' and S6', and foggy state S6' overlaps with foggy states S5' and S7'. In some embodiments, all or some of the foggy states do not overlap.

In the third phase of programming, the distributions are tightened up from the foggy states S1'-S7' to the final states S1-S7. This is depicted graphically by FIG. 10D. As noted above, some memory cells may be in the third phase while others are the in second phase. Also, a memory cell could skip either the second or third phase. As noted, the second phase is not required for all states. Also, a memory cell could have its threshold voltage go past the verify high level in the same programming pulse as it crossed the verify low level, in which case it does not undergo the slow programming associated with the third phase. In some embodiments, data state S0 is wider than data states S1-S7.

Note that many variations of programming are possible. Rather than eight states, there may be two, four, sixteen, or some other number of states. There are also many possible variations to the programming phases. For example, programming to the intermediate state IM is skipped in one embodiment.

When programming data to multiple states (e.g., rather than binary programming), it is important that the programming process be sufficiently precise so that the read process can unambiguously distinguish between the different threshold voltage distributions. For example, the tighter the threshold voltage distribution, the easier it is to unambiguously read the memory cells.

As noted above, one solution for achieving tight threshold voltage distributions, without unreasonably slowing down the programming process, includes both low- and high-verify levels for a given state. Programming to the low verify level may be referred to as a coarse programming phase. This includes an attempt to raise a threshold voltage in a faster manner and paying less attention to achieving a tight threshold voltage distribution. Programming to the high verify level may be referred to as a fine programming phase. This attempts to raise the threshold voltage in a slower manner in order to reach the target threshold voltage, while also achieving a tighter threshold voltage distribution.

Figure 11A:
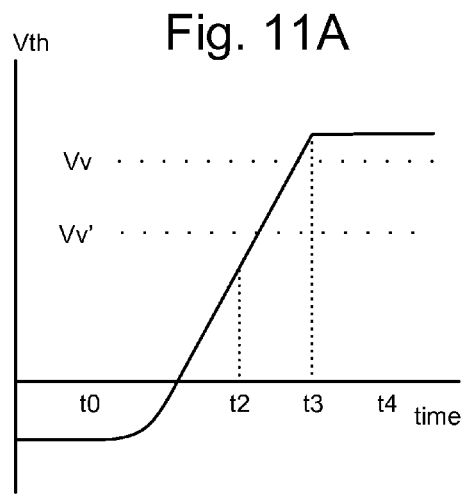
FIGS. 11A, 11B, 12A and 12B provide more details of one example of a coarse/fine programming methodology.
Figure 12A:
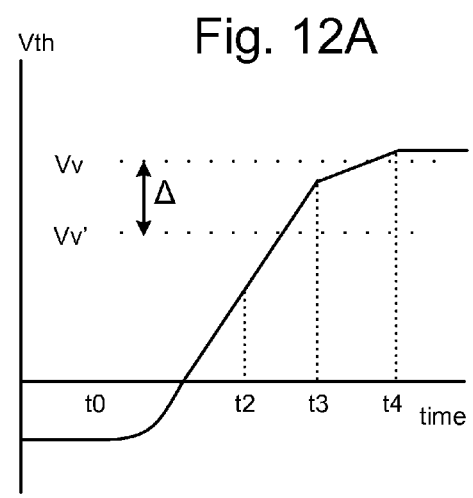
Figure 11B:
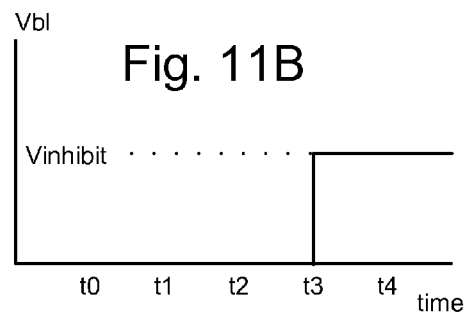
Figure 12B:
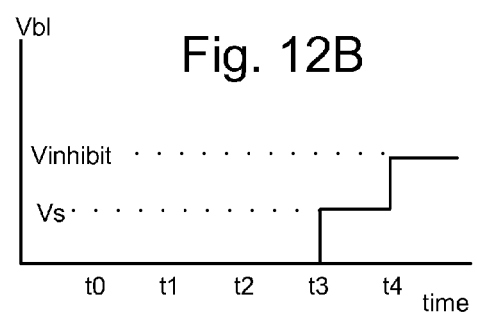

FIGS. 11A, 11B, 12A and 12B provide more details of one example of a coarse/fine programming methodology. FIGS. 11A and 12A depict the threshold voltage of the memory cells being programmed. FIGS. 11B and 12B depict the bit line voltages for the memory cells being programmed. This example of FIGS. 11A, 11B, 12A and 12B uses two verify levels, indicated in the Figures as Vv' and Vv. The final target level is Vv. FIGS. 10C and 10D show examples of such low and high verify levels for several states.

When a threshold voltage of the memory cell has reached Vv, the memory cell will be inhibited from further programming by applying an inhibit voltage to the bit line corresponding to that memory cell. For example, the bit line voltage can be raised to Vinhibit (See FIG. 11B and FIG. 12B). However, when a memory cell has reached a threshold voltage close to (but lower than) the target value Vv, the threshold voltage shift for the memory cell during subsequent programming pulses is slowed down by applying a certain bias voltage to the bit line, typically in the order of 0.3v to 0.8v. Because the rate of threshold voltage shift is reduced during the next few programming pulses, the final threshold voltage distribution can be narrower than with other programming methods. To implement this method, a second verify level that is lower than that of Vv is used. This second verify level is depicted in 11A and 12A as Vv', with Vv>Vv'. When the threshold voltage of the memory cell is larger than Vv', but still lower than Vv, the threshold voltage shift to the memory cell will be reduced for subsequent programming pulses by applying a bit line bias Vs (FIG. 12B). Note that in this case, two verify operations may be used for each state. One verify operation at the corresponding Vv for each state, and one verify operation at the corresponding Vv' for each state. Note that some states, such as the highest state, might not have a low verify level.

FIGS. 11A and 11B show the behavior of a memory cell whose threshold voltage moves past Vv' and Vv in one programming pulse at t2. For example, the threshold voltage is depicted in FIG. 11A to pass Vv' and Vv in between t2 and t3. Thus, prior to t3, the memory cell is in the coarse phase. After t3, the memory cell is in the inhibit mode.

FIGS. 12A and 12B depict a memory cell that enters both the coarse and fine programming phases. The threshold voltage of the memory cell crosses Vv' in between time t2 and time t3 (e.g., from a programming pulse applied starting at t2). Prior to t3, the memory cell is in the coarse phase. After t3, the bit line voltage is raised to Vs; therefore, the memory cell is in the fine phase. In between t3 and t4, the threshold voltage of the memory cell crosses Vv; therefore, the memory cell is inhibited from further programming by raising the bit line voltage to Vinhibit at t4. If the coarse/fine programming scheme was not being used, the threshold voltage of the memory cells could exceed Vv by a margin much more than depicted in FIG. 12A.

The voltage Vv is greater than the voltage Vv' by a difference referred to as A (see FIG. 12A). One possible way to achieve the immediately above-described coarse/fine programming process is to apply consecutive verify operations at two different control gate (Word Line) voltages, for each data state. For example, the wave form of FIG. 9B would include fourteen verify pulses rather than seven if memory cells are being programed to states S1-S7. However, having two consecutive verify operations for each data state slows down the program/verify process because the time needed to change the word line voltage is longer than desired. For example, as the word lines become longer to connect with more memory cells, the RC delays increase and slow the down the process of changing the word line voltage. Likewise, as parasitic capacitance between word lines becomes greater due to more closely spaced word lines, the RC delay increases.

To address the decrease in speed of the program/verify process because of the time needed to change the word line voltage, a variation of the above-described coarse/fine programming process can be used where the control gate (word line) voltage is the same for both verify operations (verify at Vv' and at Vv) for each data state. In this scheme, the sense amplifier 870 will test for two different threshold voltages (e.g., Vv' and Vv) by sensing the memory cell for two different currents. In one embodiment, sensing for verify at Vv' and at Vv is performed without changing the voltage on the selected word line. Further details are discussed below.

FIG. 13A shows threshold distributions of memory cells just after programming is complete with read reference levels Vr1, Vr2, Vr3, Vr4, Vr5, Vr6, and Vr7. Read level Vr1 is used to test for whether memory cells have a threshold voltage above or below that level. By testing for all read reference levels, a determination can be made which state each memory cell is in.

However, there may be some overlap between threshold voltage distributions. This is depicted in FIG. 13B for two neighboring states. This overlap could happen to some extent at programming due to, for example, some memory cells being over-programmed or under-programmed. Also, the threshold voltage distributions could spread out over time due to, for example, read disturb. Read disturb is a phenomenon in which the threshold voltage of a memory cell changes slightly due to a voltage applied to read the memory cell.

In one embodiment, soft bits are used to improve the accuracy of read operations. The read levels Vr1, Vr2, Vr3, Vr4, Vr5, Vr6, and Vr7 may be referred to as "hard bits". As noted above, error correction can be used to accurately determine the state to which a memory cell was intended to be programmed even if its present threshold voltage is not at the correct range.

FIG. 13B depicts two neighboring threshold voltage distributions with reference levels for a hard bit (HB) and two associated soft bits (SB', SB). The hard bit is for one of the read levels Vr1-Vr7. In this example, the soft bits are at about the center of one of the two threshold voltage distributions. This is just one example. Also, there could be more than two soft bits associated with the hard bit.

In one embodiment, a memory cell is sensed at the hard bit reference level and the two soft bit reference levels. This information can be fed into an error correction control process. This provides more data that can be used by the correction engine to speed up or otherwise aid convergence in the error correction process. In one embodiment, sensing of the hard bit and two soft bits is performed without changing the voltage on the selected word line.

Figure 14:
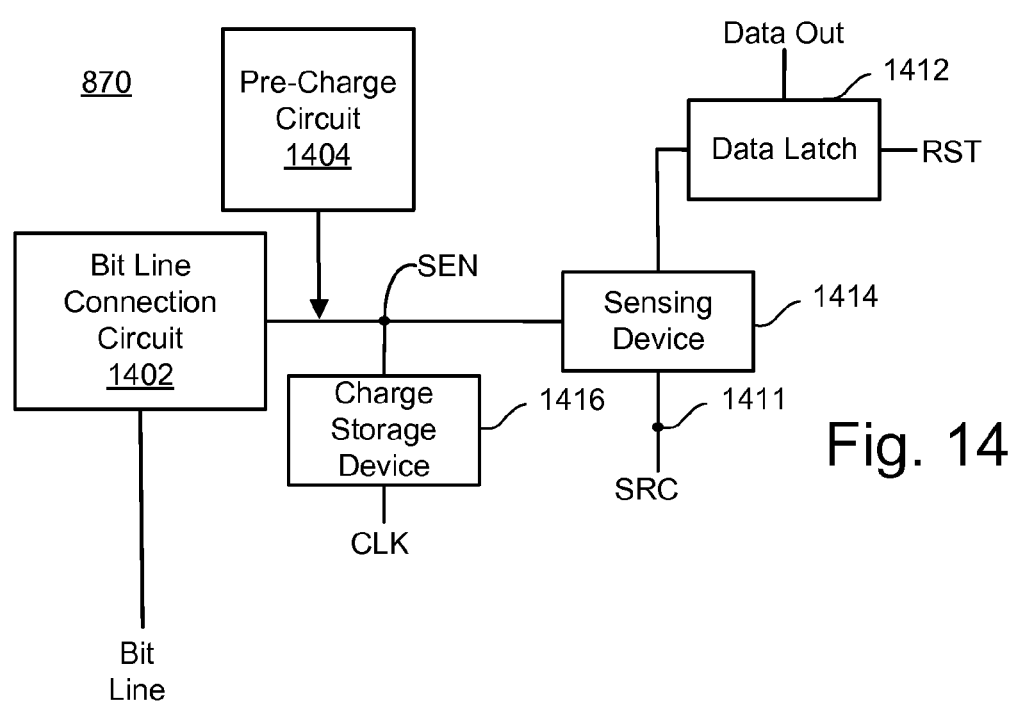
FIG. 14 is a diagram of one embodiment of sensing circuit sense circuitry.

FIG. 14 is a diagram of one embodiment of sensing circuit sense circuitry 870 (see FIG. 8). The circuit 870 may be used to sense multiple threshold voltage levels while the same voltage is applied to the selected word line. The circuit 870 has a charge storage device 1416 having a node that serves as a sense node (SEN). A second node of the charge storage device 1416 is provided with a clock signal (CLK). The clock signal CLK may be used to adjust the voltage at the sense node SEN. In one embodiment, the charge storage device 1416 is implemented with a capacitor.

The sense node (SEN) is connected to a sensing device 1414. The sensing device 1414 senses the voltage at SEN node and determines whether the voltage is above/below a target level. This may be used to determine whether a memory cell has a threshold voltage above/below a reference level. Node 1411 of the sensing device 1414 is provided with signal SRC. The SRC signal may be used to modify the target level that the sensing device 1414 tests for. This may be referred to as adjusting the trip point of the sensing device 1414. In one embodiment, the sensing device 1414 is implemented with a transistor. Thus, the trip point may be defined by whether the transistor turns on or not in response to the voltage at SEN.

The data latch 1412 stores a result of the sensing device 1414, which may be provided by the data out line. The data latch 1412 inputs a reset signal RST, which resets the data latch 1412 between sensing operations.

The pre-charge circuit 1404 establishes a voltage at the SEN node. This is done to establish an initial reference voltage at the sense node SEN. This is accomplished by charging the charge storage device 1416 in one embodiment.

The bit line connection circuit 1402 connects/disconnects the charge storage device 1416 from the bit line. The bit line is associated with the memory cell being sensed. After a reference voltage has been applied to the control gate of the selected memory cell, the charge storage device 1416 is connected to the bit line to allow the conduction current of the selected memory cell to discharge the charge storage device 1416 for a sensing time. Then, the charge storage device 1416 is disconnected from the bit line to stabilize the voltage on the sense node SEN such that the condition of the memory cell may be sensed.

Figure 15:
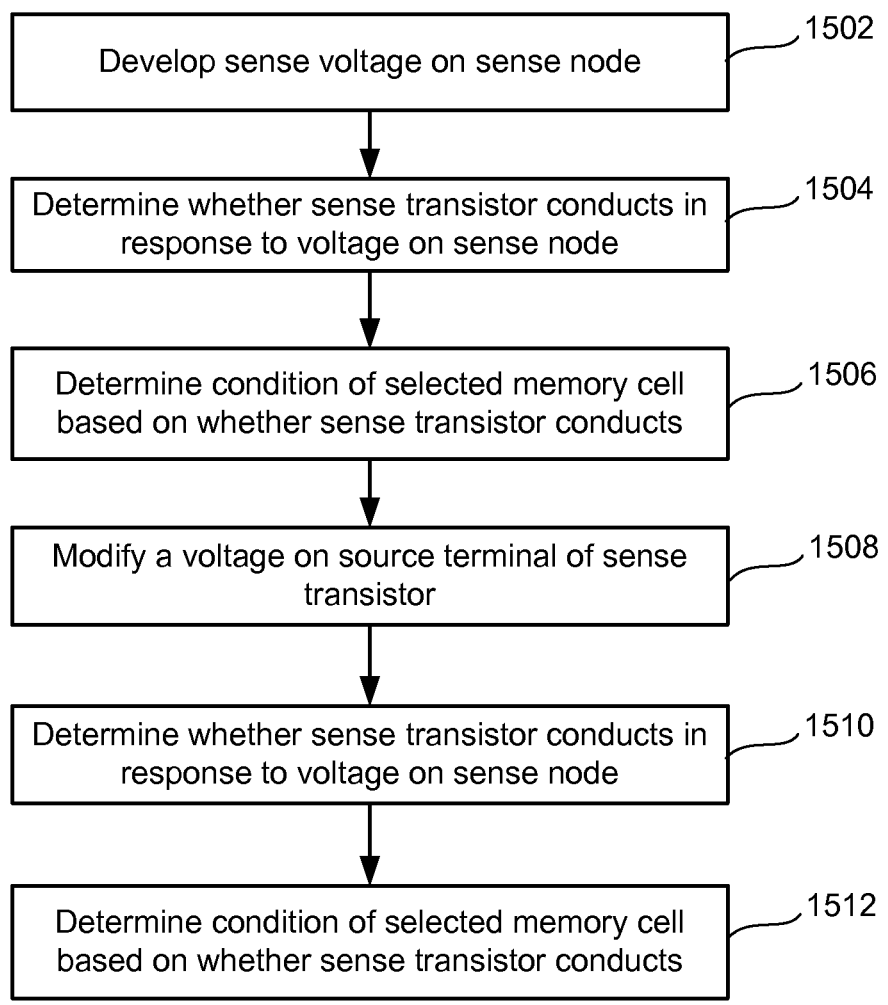
FIG. 15 is a flowchart of one embodiment of a process that is used to determine multiple conditions of a memory cell.

FIG. 15 is a flowchart of one embodiment of a process that is used to determine multiple reference levels while the same voltage is applied to the selected word line. In one embodiment, the process is used to sense a verify low level and a verify high level while the same voltage is applied to the selected word line. In one embodiment, the process is used as a part of a process that reads a hard bit and soft bits while the same voltage is applied to the selected word line. FIG. 23 shows how the process of FIG. 15 can be expanded to read a hard bit and two soft bits. Reference will be made to the circuit 870 of FIG. 14 to facilitate explanation of the process of FIG. 15. Note that prior to the process of FIG. 15 a reference voltage may be applied to the selected word line.

In step 1502 a sense voltage is developed on the sense node SEN. In one embodiment, the sense node SEN is connected to the gate of a sensing transistor that has a source terminal connected to SRC. The sense node SEN is associated with a selected non-volatile storage element. A selected non-volatile storage element means one that is selected to be sensed. In one embodiment, the selected non-volatile storage element is on a NAND string associated with the sense node SEN.

Developing the sense voltage on the sense node may include developing a voltage that is representative of a condition of the selected non-volatile storage element. Step 1502 may include connecting the sense node SEN to the selected non-volatile storage element to allow a conduction current of the selected non-volatile storage element to discharge the sense node to some extent. Further details are discussed below.

In step 1504, a determination is made whether the sensing device 1414 conducts a current in response to the sense voltage on the sense node SEN. For example, a determination is made whether a sense transistor conducts a significant current or turns on in response to the voltage on the sense node SEN. At this time, the node 1411 of the sensing device 1414 could be grounded, as one possibility.

In step 1506, a condition of the selected non-volatile storage element is determined with respect to a first reference level based on whether the sensing device 1414 conducts a current in response to the sense voltage on the sense node SEN. As one example, a determination is made whether the memory cell has a threshold voltage above/below a verify low level (e.g., one of the levels Vv1'-Vv7'). As another example, a determination is made whether the memory cell has a threshold voltage above/below a soft bit level (e.g., soft bit SB' in FIG. 13B). This determination may be made by circuitry connected to the sense circuit 870. For example, the data from the data latch 1412 may be provided to the processor 892, control circuitry 720, and/or controller 744 to make this determination.

In step 1508, the voltage on node 1411 of the sensing device 1414 (e.g., a source terminal of the sense transistor) is modified. For example, the signal SRC is used to modify the voltage on the node 1411 of sensing device 1414. In one embodiment, the voltage on the node 1411 is increased in step 1508 to allow the sensing device 1414 to test for a different reference level.

In step 1510, a determination is made whether the sensing device 1414 conducts a current in response to the sense voltage on the sense node SEN, with the present voltage on node 1411. For example, a determination is made whether sensing device 1414 conducts a significant current or turns on in response to the voltage on the sense node SEN given the present voltage on node 1411.

In step 1512, a condition of the selected non-volatile storage element is determined with respect to a second reference level based on whether the sensing device 1414 conducts a current in response to the sense voltage on the sense node SEN. As one example, a determination is made whether the memory cell has a threshold voltage above/below a verify high level. As another example, a determination is made whether the memory cell has a threshold voltage above/below a hard bit level or a different soft bit level than step 1506. This determination may be made by circuitry connected to the sense circuit 1400, as discussed in step 1506.

Note that the voltage on the selected word line may remain constant between steps 1504 and 1510.

Figure 16:
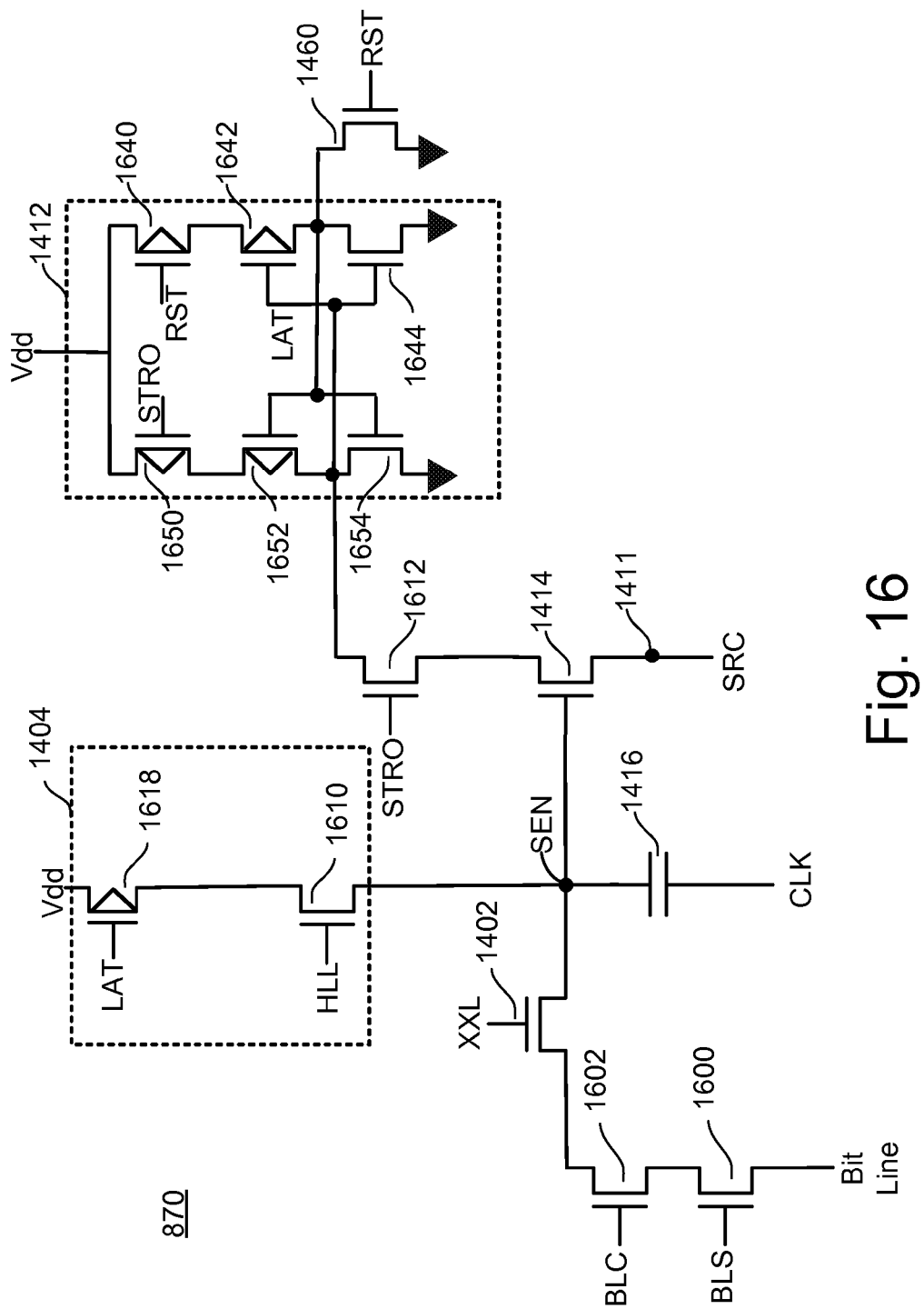
FIG. 16 is a schematic diagram depicting one embodiment sense circuitry.

FIG. 16 is a schematic diagram depicting one embodiment sense circuitry 870 (see FIGS. 8 and 14). The sense circuitry 870 could be used during the process of FIG. 15, as well as other processes described below. As described below, the circuit of FIG. 16 will pre-charge a capacitor (or other charge storage device) to a pre-charge magnitude, discharge the capacitor through the memory cell for a sensing time, and sense voltage at the capacitor after the sensing time. Though FIG. 16 features one capacitor 1416, in some embodiments, any suitable charge storage device can replace or complement this capacitor 1416. The sense voltage will be indicative of whether the memory cell conducted the current being sensed for, which is indicative of whether the threshold voltage of the memory cell is greater than or less than a threshold voltage being tested for. If the threshold voltage of the memory cell is greater than the threshold voltage being tested, then, during a verify operation, the memory cell will enter the fine phase or complete programming, as appropriate based on the processes described above. Thus, the circuit of FIG. 16 can be used for the coarse/fine programming discussed above or for other systems that do not use coarse/fine programming. In some embodiments, the circuit of FIG. 16 can be used for read operations. For example, hard and soft bits can be read during read operations.

FIG. 16 shows transistor 1600 connected to the Bit Line and transistor 1602. Transistor 1600 receives the signal BLS at its gate, and is used to connect to or isolate the Bit Line. Transistor 1602 receives the signal BLC at its gate, and is used as a voltage clamp. The gate voltage BLC is biased at a constant voltage equal to the desired Bit Line voltage plus the threshold voltage of transistor 1602. The function of transistor 1602, therefore, is to maintain a constant Bit Line voltage during a sensing operation (during read or verify), even if the current through the Bit Line changes.

Transistor 1602 is connected to transistor 1402. Transistor 1402 is connected to capacitor 1416. The purpose of transistor 1402 is to connect capacitor 1416 to the Bit Line and disconnect capacitor 1416 from the Bit Line so that capacitor 1416 is in selective communication with Bit Line. In other words, transistor 1402 regulates the sensing time. That is, while transistor 1402 is turned on capacitor 1416 can discharge through the Bit Line, and when transistor 1402 is turned off capacitor 1416 cannot discharge through the Bit Line.

The SEN node at which transistor 1402 connects to capacitor 1416 is also connected to the gate of sensing transistor 1414. Thus, the upper plate of capacitor 1416 is connected to the gate of sensing transistor 1414. The lower plate of capacitor 1416 is connected to clock signal CLK. The purpose of clock signal CLK is to raise or lower the voltage on the upper plate of the capacitor 1416, and hence raise or lower the voltage on the sense node SEN.

The SEN node is also connected to transistor 1610, which is connected to transistor 1618. The signal HLL is provided to the gate of transistor 1610. The signal LAT is provided to the gate of transistor 1618. A purpose of transistors 1610 and 1618 is to pre-charge the sense node SEN. A voltage (e.g. Vdd or other voltage) is applied to the source of transistor 1618. By appropriately biasing transistors 1618 and 1610, the voltage applied to the source of transistor 1618 can be used to pre-charge capacitor 1416. After pre-charging, capacitor 1416 can discharge through the Bit Line via transistor 1402 (assuming that transistors 1600 and 1602 are conducting).

The sensing transistor 1414 has a source node 1411 that is provided with a source signal SRC. A purpose of the source signal SRC is to adjust the reference level that the sense transistor 1414 tests for. In other words, the source signal SRC modifies the trip point of sensing transistor 1414. The drain of sense transistor 1414 is connected to a strobe transistor 1612. The gate of the strobe transistor 1612 is provide with a strobe signal STRO. A purpose of the strobe transistor 1612 is to connect the sensing transistor 1414 to the latch circuit 1412.

The latch circuit 1412 includes transistors 1640, 1642, 1644, 1650, 1652, and 1654. Transistor 1650 receives the strobe signal STRO at its gate. Transistor 1640 receives a reset signal RST at its gate. The gates of transistors 1652 and 1654 are tied together. The LAT voltage in the data latch 1412 represents a condition of the memory cell. In one embodiment, LAT will be high of the memory cell passes a verify condition and low if the memory cell fails the verify condition. Thus, a high LAT means that the memory cell has a threshold voltage above the reference level, in one embodiment. Thus, a low LAT means that the memory cell has a threshold voltage below the reference level, in one embodiment.

A reset transistor 1460 is connected to the gates of transistors 1652 and 1654. The gate of reset transistor 1460 is provided with the reset signal RST. Thus, the reset signal RST may be used to reset the latch 1412.

As discussed above, capacitor 1416 is pre-charged via transistors 1610 and 1618. This will raise the voltage at the node SEN to a pre-charge voltage level (Vpre). When transistor 1402 turns on, capacitor 1416 can discharge its charge through the Bit Line and the selected memory cell if the threshold voltage of the memory cell is below the voltage level being tested for. If the capacitor 1416 is able to discharge, then the voltage at the capacitor (at the SEN node) will decrease.

The pre-charge voltage (Vpre) at the SEN node is greater than the threshold voltage of transistor 1414; therefore, prior to the sense time, transistor 1414 is on (conducting). Since transistor 1414 is on during the sense time, then transistor 1612 should be off. If the capacitor 1416 does not discharge during the sense time, then the voltage at the SEN node will remain above the threshold voltage of transistor 1414. With the sense transistor 1414 on and transistor 1612 on LAT in the data latch 1412 goes high, in one embodiment.

If the capacitor 1416 discharges sufficiently during the sense time, then the voltage at the SEN node will decrease below the threshold voltage of transistor 1414; thereby, turning off transistor 1414. In this case, LAT in the data latch 1412 will be low, in one embodiment. The voltage at LAT in the data latch 1412 may be provided to managing circuitry outside of the sense circuit 870. In one embodiment, a compliment of the voltage at LAT in the data latch 1412 is provided to managing circuitry outside of the sense circuit 870. Thus, the condition of the memory cell with respect to a reference level (e.g., threshold voltage) may be determined by the sense circuit 870 and/or by managing circuitry outside of the sense circuit 870.

Figure 17:
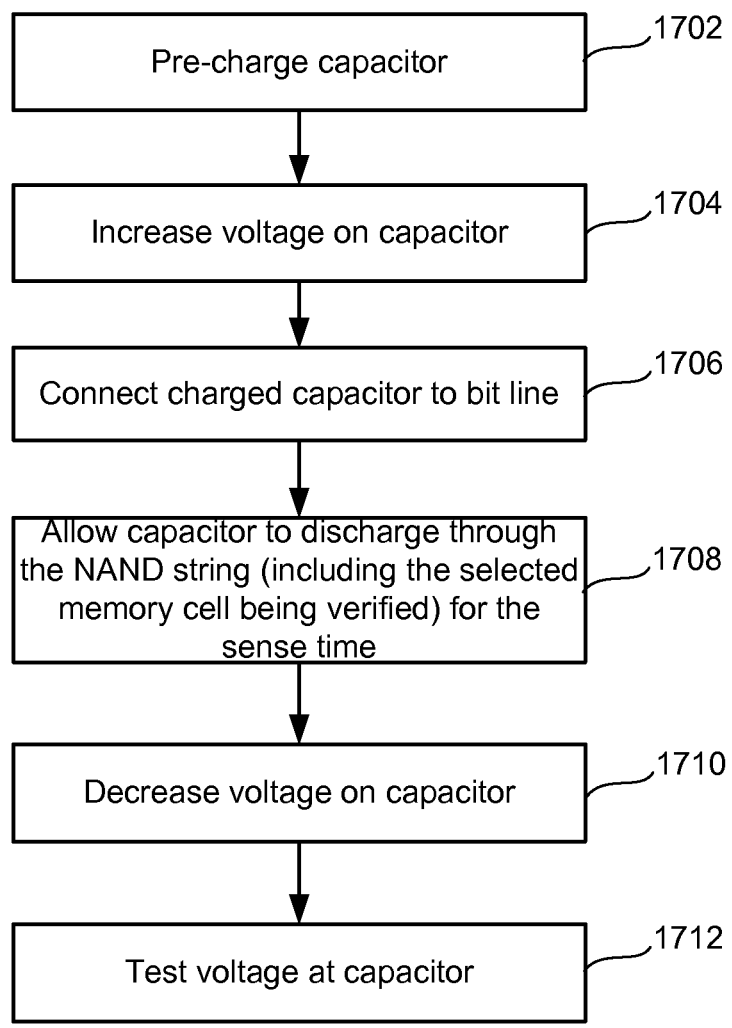
FIG. 17 is a flowchart describing one embodiment sensing a memory cell.
Figure 18:
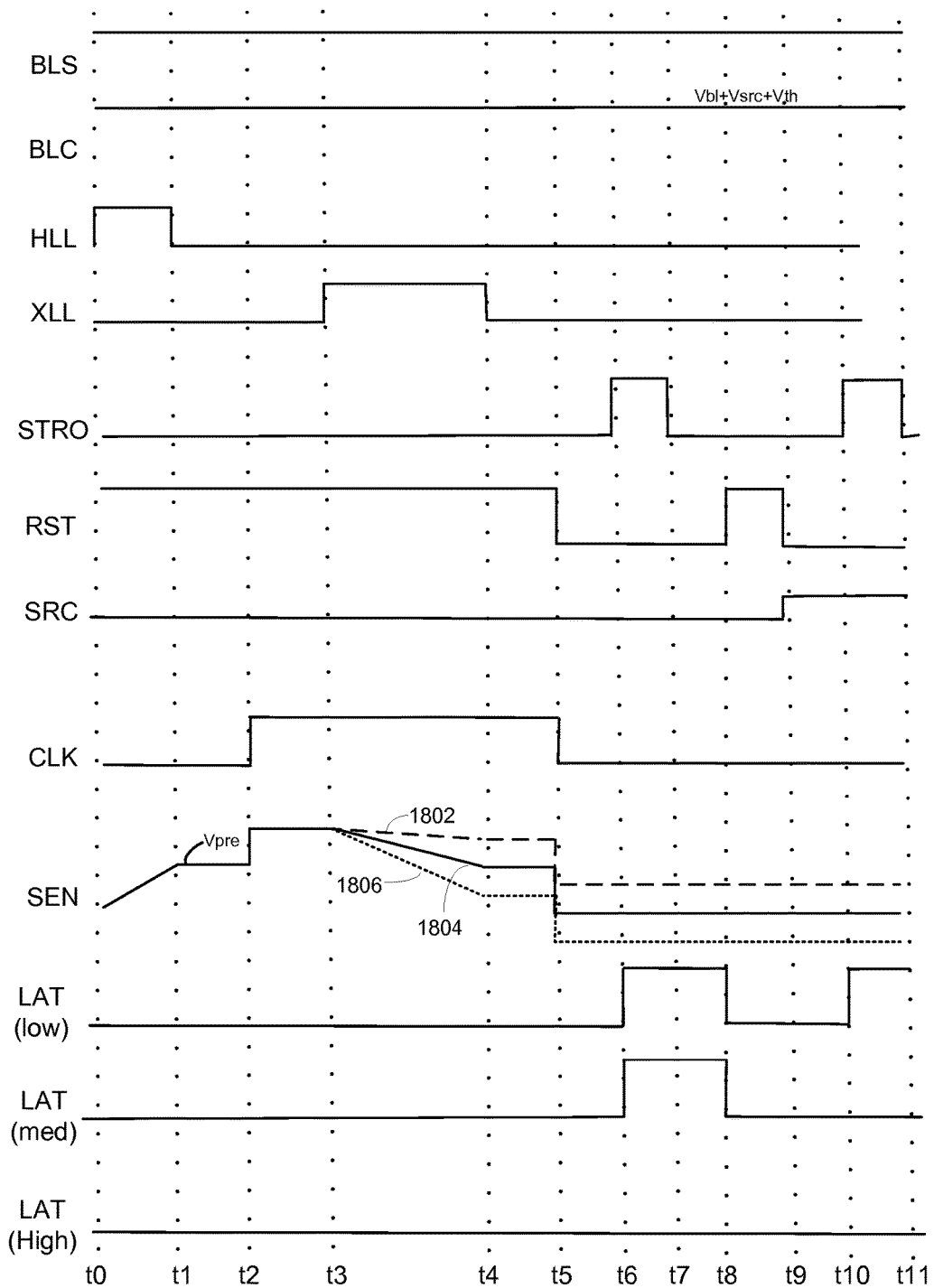
FIG. 18 contains timing signals for the circuit of FIG. 16 for one embodiment of the process of FIG. 17.

FIG. 17 is a flowchart describing one embodiment sensing a memory cell. The process includes one example implementation of steps 1502 and 1504 of the process of FIG. 15. The process of FIG. 17 can be executed by the circuit of FIG. 16. The embodiment of FIG. 17 assumes a structure in which a charge storage device 1416 will discharge its charge through the selected memory cell in order to detect current. One example of such a structure is depicted at least in part by FIG. 16, as described above. In the example of FIG. 16, the charge storage device 1416 comprises a capacitor. However, in other embodiments, other types of charge storage devices can also be used. FIG. 18 contains timing signals that will be referred to when discussing the process of FIG. 17.

In step 1702 of FIG. 17, the capacitor (or other charge storage device) will be pre-charged to a pre-determined voltage level. Referring to FIG. 18, between time t0 and t1, HLL is high and LAT is low. These conditions turn on both transistors 1618 and 1610, connecting the top plate of the capacitor 1416 to Vdd (or some other voltage). At time t1, the voltage at SEN is at the pre-charge voltage Vpre. Note that Vpre is not required to be Vdd, as the time for which HLL is high can be adjusted to establish a suitable Vpre. At time t1, HLL is low, which turns off transistor 1610 to stop the pre-charging.

In step 1704, the voltage on the capacitor 1416 (or other charge storage device) is increased. Referring to FIG. 18, at time t2 the clock signal CLK is raised. This has the effect of raising the voltage at SEN by a similar amount. Referring to FIG. 16, raising CLK at the bottom plate of capacitor 1416 has the effect of raising the top plate of the capacitor 1416 (or sense node SEN) by a similar amount.

In step 1706, the pre-charged capacitor (or other charge storage device) will be connected to the bit line. Referring to FIG. 18, at time t3, the signal XXL goes high. Also note that BLC may be high at this time. Likewise, BLS may be high at this time. Referring now to FIG. 16, XXL is provided to the gate of transistor 1402, thus turning on transistor 1402. Also, transistors 1600 and 1602 are on at this time. This connects the sense node SEN to the bit line.

In step 1708, the capacitor 1416 is allowed to discharge its charge through the bit line and NAND string (including the selected memory cell being sensed). The system will wait for a sense time in step 1708. Referring to FIG. 18, the signal XXL remains high from time t3 to t4. Note that the entire process only needs one sense time.

Also referring to FIG. 18, between t3 and t4, the sense node SEN discharges. Three different discharge rates are depicted. These rates will be discussed more fully below. Briefly, curve 1802 is associated with a memory cell having a low conduction current, curve 1084 is associated with a memory cell having a medium conduction current, and curve 1806 is associated with a memory cell having a high conduction current. Stated another way, curve 1802 is associated with a memory cell having a threshold voltage above a higher reference level. Curve 1804 is associated with a memory cell having a threshold voltage between a lower reference level and the higher reference level. Curve 1806 is associated with a memory cell having a threshold voltage below the lower reference level.

In step 1710, the voltage on the capacitor 1416 is decreased. Referring to FIG. 18, at time t5 the clock signal CLK is lowered. This has the effect of lowering the voltage at SEN by a similar amount.

In step 1712, the voltage on the capacitor 1416 is tested. The system will calculate the change in voltage across the capacitor from the pre-charge voltage to the voltage detected in step 1712. Referring to FIG. 18, at time t6, the strobe signal STRO goes high. Also note that prior to this at time t5, the reset signal RST went low to reset the latch circuit. Referring to FIG. 16, the sense transistor 1414 will be either on or off in response to the voltage on the sense node SEN. With the strobe signal STRO high, transistor 1612 is on, which provides a current path between the sense transistor 1414 and the latch circuit 1412. The value of LAT in the data latch 1412 will be set based on whether the sense transistor 1414 conducts. There are three LAT conditions depicted in FIG. 18. LAT (low) corresponds to the low current conduction curve 1802, LAT (medium) corresponds to the medium current conduction curve 1804, LAT (high) corresponds to the high current conduction curve 1806. These three LAT conditions will be discussed more fully below.

Figure 19:
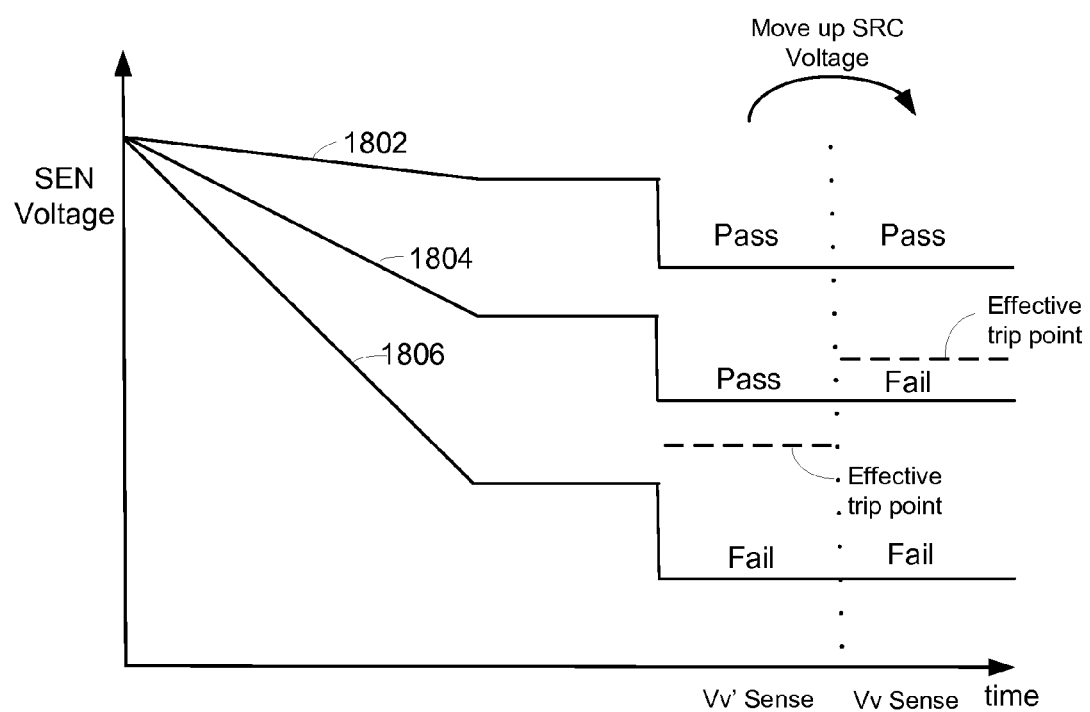
FIG. 19 is a diagram to illustrate one embodiment in which the trip point of the sense circuit is changed by increasing the voltage on the source node of the sense transistor.

In one embodiment, the trip point of the sense circuit 870 is changed by increasing the voltage on the source node of the sense transistor 1414. FIG. 19 is a diagram to illustrate this embodiment. The diagram shows the voltage on the sense node (SEN) over time. These time frame corresponds to t3-t1 in FIG. 18. The following discussion will use an example in which verify low Vv' is the low reference level and verify high Vv is the high reference level. However, the low and high reference levels do not need to be for verify low and verify high.

Curve 1802 is associated with a memory cell having a low conduction current, curve 1084 is associated with a memory cell having a medium conduction current, and curve 1806 is associated with a memory cell having a high conduction current. Also depicted are "effective trip points". These are the voltages at which the sense transistor 1414 will flip from off to on. The effective trip point changes when increasing the voltage on the source node 1411 of the sense transistor 1414. This occurs between the phase for sensing verify low and the phase for sensing verify high.

A memory cell having a very low conduction current has a relatively high threshold voltage. Thus, it should pass both the verify low Vv' and verify high Vv tests. This is reflected by curve 1802.

A memory cell having a medium conduction current has a threshold voltage between the verify low Vv' and verify high Vv levels and hence should pass verify low, but fail verify high. Thus, it should pass the verify low Vv', but fail the verify high Vv test. This is reflected by curve 1804.

A memory cell having a high conduction current has a threshold voltage below the verify low Vv' and verify high Vv levels and hence should fail both verify low and verify high. This is reflected by curve 1806.

Reference will be made again to FIG. 16 to explain how increasing the voltage on the source node 1411 of the sense transistor 1414 changes the trip point. The trip point is the threshold voltage of the sense transistor 1414 plus the voltage on the source node 1411, in one embodiment. By increasing the voltage on the source node 1411, the trip point increases. The trip point could be decreased by decreasing the voltage on the source node 1411.

Note that the capacitance of the sense transistor 1414 can be relatively low. Therefore, changing the voltage on the source node 1411 can be achieved quickly with little current consumption. These are important advantages in that reducing the time to verify and reducing current consumption are significant benefits.

FIG. 20 is one embodiment of a process of verifying memory cells during a programming operation. In this process, memory cells are verified to a low- and a high-verify level. This may be used for what is referred to a "quick pass write" (QPW). Reference will be made to the example circuit of FIG. 16 and the example timing diagram of FIG. 18. The process of FIG. 20 uses the technique described in FIG. 19 of raising the voltage on the source node 1411 of the sense transistor 1414.

In step 2002, a voltage is applied to the word line for the selected memory cell being programmed and verified while maintaining the voltage level of the bit line to which the memory cell is connected at a constant value. This word line voltage is applied based on the data state being verified. As explained above, different control gate voltages are used to verify programming to different data states. As discussed above, for at least some of the data states, there will be two sensing operations, one for the respective Vv' and one for the respective Vv. The same word line voltage will be applied to the word line for both sensing operations for a given data state.

In step 2004, the system will sense current through the memory cell for the first sensing operation. This is used to determine whether the memory cell is at the low verify level Vv'. If the memory cell has a threshold voltage above the low verify level Vv' it should not conduct a significant current. If the memory cell has a threshold voltage below the low verify level Vv' it should conduct a significant current.

Referring to the timing diagram of FIG. 18, this sensing may occur between times t6 and t7. Thus, note that the various steps of pre-charging the sense node SEN and discharging the sense node SEN to the bit line may be performed prior to step 1904. Sensing up to this point was described above with respect to the process of FIG. 17. In one embodiment, LAT goes high when the memory cell passes the verify low test. Memory cells having low conduction current (curve 1802) or medium conduction current (curve 1804) pass the verify low test, and thus have LAT high. Referring to FIG. 18, LAT is high between time t6 and t8 for memory cells having a low current or medium current.

In step 1906, the system will sense current through the memory cell for the second sensing operation. This is used to determine whether the memory cell is at the high verify level Vv. Referring to the timing diagram of FIG. 18, this sensing may occur between times t10 and tn.

Referring to FIG. 18, after the first sensing operation is over at time t7, the following may be performed. The reset signal RST is brought high between times t8 and t9 to reset the latch 1412. The source signal SRC is raised at time t9. This changes the trip point of the sense transistor 1414. Referring to FIG. 19, this raises the effect trip point to set up sensing for the high verify level.

At time t10, the strobe signal STRO is raised. This again connects the sense transistor 1414 to the latch 1412. Depending on whether the sense transistor 1414 turns on and conducts a current, the value of LAT in the latch 1412 will be set accordingly.

In one embodiment, LAT goes high when the memory cell passes the high verify test. Memory cells having low conduction current (curve 1802) pass the verify high test, and thus have LAT high. However, memory cells having medium or high conduction current (curves 1804 and 106, respectively) fail the verify high test, and thus have LAT low. Referring to FIG. 18, LAT is high between after time t10 for memory cells having a low conduction current. LAT is low between after time t10 for other memory cells.

Note that steps 2004 and 2006 may both be performed while the voltage that was applied to the word line in step 2002 remains constant.

If it is determined that the threshold voltage of the memory cell is greater than or equal to Vv (see step 2008), then in step 2016 that memory cell is locked out from further programming for this particular programming process. If, however, it is determined that the threshold voltage of the memory cell is less than Vv, then it is determined whether the threshold voltage in memory cell is greater than or equal to Vv' (step 2010). If the threshold voltage in the memory cell is greater than or equal to Vv', then in step 2014, the bit line voltage is raised to Vs to slow down programming and enter the fine phase. If the threshold voltage is below the Vv', then in step 2012, the bit line voltage is maintained at Vs so that additional coarse programming can be performed.

In one embodiment, the voltage on the bottom plate of the capacitor 1416 is modified to be able to test for different reference levels with the same voltage applied to the selected word line. FIG. 21 shows a diagram to illustrate the foregoing. The diagram shows the voltage on the sense node (SEN) over time. These time frame corresponds to t3-t11 in FIG. 18. This is for an example in which verify low and verify high is tested, as indicated by the time axis.

Curve 1802 is associated with a memory cell having a low conduction current, curve 1084 is associated with a memory cell having a medium conduction current, and curve 1806 is associated with a memory cell having a high conduction current. Also depicted is "trip point". This is the voltage at which the sense transistor 1414 will flip from off to on.

A memory cell having a very low conduction current has a relatively high threshold voltage. Thus, it should pass both the verify low Vv' and verify high Vv tests. This is reflected by curve 1802.

A memory cell having a medium conduction current has a threshold voltage between the verify low Vv' and verify high Vv levels and hence should pass verify low, but fail verify high. Thus, it should pass the verify low Vv', but fail the verify high Vv tests. This is reflected by curve 1804.

A memory cell having a high conduction current has a threshold voltage below the verify low Vv' and verify high Vv levels and hence should fail both verify low and verify high. This is reflected by curve 1806.

Reference will be made again to FIG. 16 to explain how decreasing the voltage on the bottom plate of the capacitor 1416 allows multiple reference levels to be tested. By increasing the voltage on the bottom plate of the capacitor 1416, the voltage on the sense node SEN increases. This changes the voltage at the gate of the sense transistor 1414.

The foregoing technique may be combined with the technique of modifying the voltage on the source node 1411 of the sense transistor 1414. In one embodiment, combining these two techniques is used to read a hard bit and two soft bits. FIG. 22 shows a diagram to illustrate one embodiment of combining the two techniques to read a hard bit HB and two soft bits SB', SB.

The four curves 2202, 2204, 2206, and 2208 in FIG. 22 correspond to memory cells that are in one of four different regions with respect to the soft and hard bits. Referring to FIG. 13B, memory cells having a threshold voltage below SB' should have the highest conduction current in response to voltage applied to the selected word line. These memory cells are associated with curve 2208. Memory cells having a threshold voltage between SB' and HB are associated with curve 2206. Memory cells having a threshold voltage between HB and SB are associated with curve 2204. Memory cells having a threshold voltage between above SB should have the lowest conduction current in response to voltage applied to the selected word line. These memory cells are associated with curve 2202.

The time axis shows that the first sensing operation is to sense for SB' (the lower soft bit). Then, the voltage on the SEN node is moved down. The next sensing operation is for the hard bit HB. Then, the voltage on the source node 1411 of the sense transistor is moved up. This modifies the effective trip point. The next sensing operation is for the upper soft bit SB.

FIG. 22 also shows above/below conditions for each curve for each sense operation. These refer to whether the memory cell has a threshold voltage above or below the reference level. For curve 2208, the memory cell has a threshold voltage below the reference level for all three cases. For curve 2206, the memory cell has a threshold voltage above the SB' reference level, but below for the other two cases. For curve 2204, the memory cell has a threshold voltage above both the SB' reference level and the HB reference level, but below for the SB reference level. For curve 2202, the memory cell has a threshold voltage above the reference level for all three cases.

FIG. 23 is a flowchart of one embodiment of a process of reading a hard bit and two soft bits. The technique described in FIG. 22 may be used. FIG. 24 shows timing signals for one embodiment in which the circuit of FIG. 16 is used.

The process starts by performing steps 1502-1506 from the process of FIG. 15. These steps develop a voltage on the sense node SEN, determine whether the sense transistor 1414 conducts in response to the voltage on the sense node SEN, and determine a condition of the selected memory cell based on whether the sense transistor conducts. These steps may be used to determine whether the threshold voltage of the memory cell is above/below the lower soft bit level SB'.

Referring to FIG. 24, the strobe signal STRO between times t6 and t7 is used to latch the result of the first sense operation. The sense node SEN shows four different curves 2202, 2204, 2206, and 2208, which correspond to four different amounts of conduction current of the selected memory cell. These refer to the curves already discussed in FIG. 22. There are four different latch conditions LAT1, LAT2, LAT3 and LAT4. These refer to the voltage at the node labeled LAT in the data latch 1412. LAT1 corresponds to curve 2202. LAT2 corresponds to curve 2204. LAT3 corresponds to curve 2206. LAT4 corresponds to curve 2208. For the first sense operation, only the highest current case (curve 2208) has a memory cell with its threshold voltage below the reference level. The low condition of LAT4 indicates this situation. The high condition of LAT1-LAT3 indicates that the memory cell has its threshold voltage above the reference level.

In step 2302 a voltage on the sense node is modified. Referring to FIG. 24, at time t9, the clock signal CLK is lowered by some amount. This has the effect of lowering the voltage on the top plate of capacitor 1416.

In step 2304, the system determines whether the sense transistor 1414 conducts in response to the voltage on the sense node. This may be used to test for the hard bit HB. Referring to FIG. 24, between times t10 and t11, strobe STRO is brought high. This causes the latch circuit 1412 to store the condition of the memory cell, based on whether or not the sense transistor 1414 conducts a current.

In step 2306, the system determines a condition of the selected memory cell based on whether the sense transistor conducts. Steps 2302-2306 may be used to determine whether the threshold voltage of the memory cell is above/below the hard bit level HB. The voltage on the node labeled LAT in the data latch 1412 may be used to determine the condition of the selected memory cell. When testing for the hard bit HB, memory cells having threshold voltages below the HB reference level should conduct a relatively high current (corresponding to curves 2206 and 2208). For such cells, LAT will be low, as indicated by LAT3 and LAT4 between times t10 and t11. On the other hand, memory cells having threshold voltages above the HB reference level should conduct a relatively low current (corresponding to curves 2202 and 2204). For such cells, LAT will be high, as indicated by LAT1 and LAT2 between times t10 and t11.

The process then performs steps 1508-1512 from the process of FIG. 15. These steps modify a voltage on the source terminal 1411 of the sense transistor 1414, determine whether the sense transistor 1414 conducts in response to the voltage on the sense node SEN, and determine a condition of the selected memory cell based on whether the sense transistor conducts. These steps may be used to determine whether the threshold voltage of the memory cell is above/below the upper soft bit level SB.

Referring to FIG. 24, the source signal SRC is raised at time t13. The effect of this on the trip point of the sense transistor 1414 has already been discussed. Between times t14 and t15, strobe STRO is brought high. This causes the latch circuit 1412 to store the condition of the memory cell, based on whether or not the sense transistor 1414 conducts a current.

When testing for the upper soft bit SB, memory cells having threshold voltages below the upper soft bit SB reference level should conduct a relatively high current (corresponding to curves 2204, 2206 and 2208). For such cells, LAT will be low, as indicated by LAT2, LAT3 and LAT4 after time t14. On the other hand, memory cells having threshold voltages above the upper soft bit SB reference level should conduct a relatively low current (corresponding to curve 2202). For such cells, LAT will be high, as indicated by LAT1 after time t14.

The technique used in the process of FIG. 23 of both modifying the voltage on the SEN node (e.g., step 2302) combined with modifying the voltage on the source node of the sense transistor can provide a better sensing margin compared with modifying the voltage on the SEN node an additional time without modifying the voltage on the source node of the sense transistor.

Figure 25:
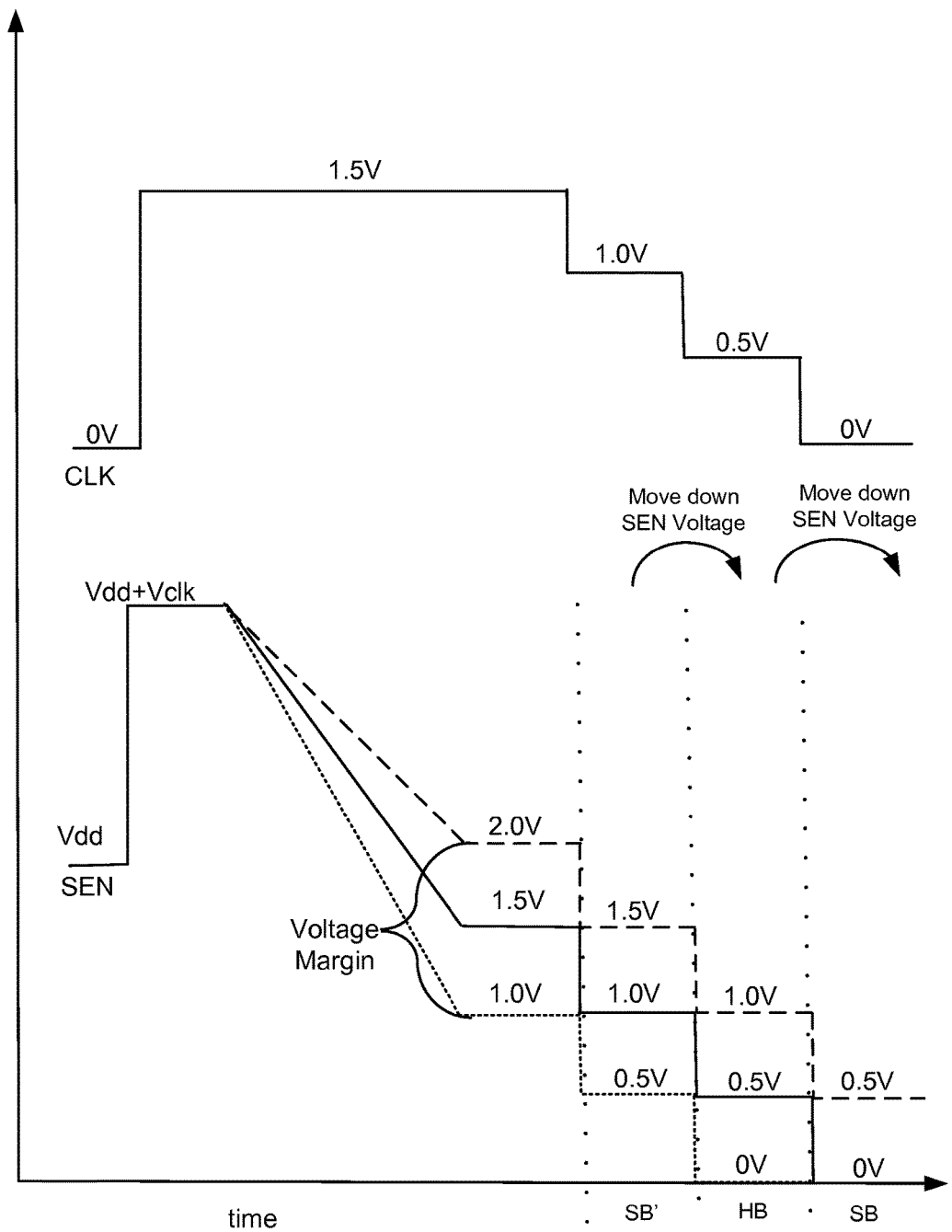
FIG. 25 is one example of sensing voltage margin when the clock CLK is dropped twice to sense three reference levels.
Figure 26:
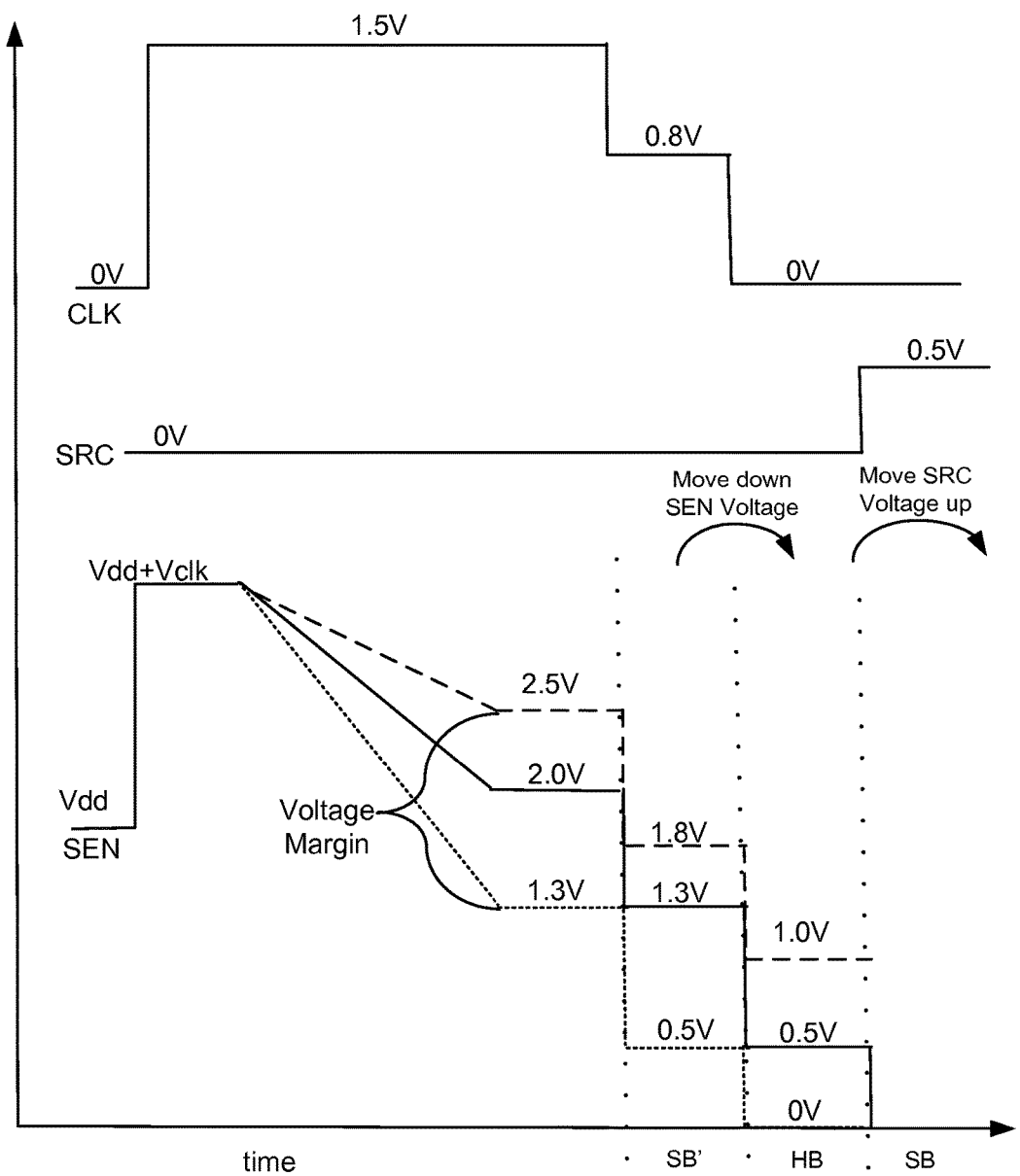
FIG. 26 is one example of sensing voltage margin when the clock CLK is dropped once and the source of the sense transistor is raised once to sense three reference levels.

FIGS. 25 and 26 provide an example to help illustrate the foregoing. FIG. 25 is one example of sensing voltage margin when the clock CLK is dropped twice to sense three reference levels. FIG. 26 is one example of sensing voltage margin when the clock CLK is dropped once and the source of the sense transistor is raised once to sense three reference levels.

Referring now to FIG. 25, the clock signal and the voltage on the sense node SEN versus time are depicted. The sense node SEN starts at Vdd, which is the pre-charge voltage. The clock CLK starts at 0V and increases to 1.5V, which increases the sense node SEN by a corresponding amount. The sense node SEN is then discharged through the bit line as discussed herein. The three curves refer to three different discharge rates depending on the threshold voltage of the memory cell. At the end of the discharge time, the curves are at 2.0V, 1.5V, and 1.0V respectively.

The clock CLK voltage is dropped three times. This is divided evenly in 0.5V steps, in this example. Thus, the clock drops to 1.0V when sensing SB', to 0.5V when sensing HB, and 0V when sensing SB. This causes a corresponding drop in the sense node SEN voltage. Note that the sense node SEN does not drop below 0V in this example.

The voltage sense margin is given by the difference between the starting sense node voltages for the two most extreme cases. This is 1.0V in this example.

Referring now to FIG. 26, the clock signal CLK, the source signal SRC, and the voltage on the sense node SEN versus time are depicted. The sense node SEN starts at Vdd, which is the pre-charge voltage. The clock CLK starts at 0V and increases to 1.5V, which increases the sense node SEN by a corresponding amount. The sense node SEN is then discharged through the bit line as discussed herein. The three curves refer to three different discharge rates depending on the threshold voltage of the memory cell. At the end of the discharge time, the curves are at 2.5V, 2.0V, and 1.3V respectively. Note that the sense time in this example may be different from the example of FIG. 25.

The clock CLK voltage is dropped twice times. This is divided as a 0.7V drop followed by a 0.8V drop. Thus, the clock drops to 0.8V when sensing SB' and to 0V when sensing HB and also when sensing SB. This causes a corresponding drop in the sense node SEN voltage. Note that the sense node SEN does not drop below 0V in this example.

In this example, the source signal SRC is raised prior to sensing the upper soft bit SB. In this example, SRC is raised by 0.5V.

The voltage sense margin is given by the difference between the starting sense node voltages for the two most extreme cases. This is 1.2V in this example. A reason for the additional margin is that the clock CLK signal is dropped one fewer time in the example of FIG. 26.

The voltage margin gain refers to the voltage margin using the technique from FIG. 26 minus the voltage margin using the technique from FIG. 25. More generally, the voltage margin gain can be expressed as follows.

$$V\text{margin Gain}=V3*(I1-I3)/I2 \qquad (1)$$

In Equation 1, I1 is the lower soft bit SB' current, I2 is the hard bit HB current, and I3 is the upper soft bit SB current. These currents refer to the conduction current that a memory cell having a threshold voltage equal to the reference level is expected to have given the reference voltage applied to the control gate of the memory cell. V3 is the final drop down in the clock signal CLK in the method that uses the additional drop in CLK. Thus, the technique of FIG. 26 may help to improve voltage margin, at least relative to the technique of FIG. 25.

One embodiment comprises a method of operating non-volatile storage, which comprising the following. A sense voltage is developed on a sense node that is connected to a sensing transistor having a source terminal. The sense node is associated with a selected non-volatile storage element. A determination is made whether the sensing transistor conducts in response to the sense voltage on the sense node. A first condition of the selected non-volatile storage element is determined with respect to a first level based on whether the sensing transistor conducts in response to the sense voltage on the sense node. A voltage on the source terminal of the sensing transistor is modified after determining the first condition with respect to the first reference level. A determination is made whether the sensing transistor conducts in response to the sense voltage on the sense node after modifying the voltage on the source terminal of the sensing transistor. A second condition of the selected non-volatile storage element is determined with respect to a second reference level based on whether the sensing transistor conducts in response to the sense voltage on the sense node after modifying the voltage on the source terminal of the sensing transistor. In one embodiment, the modifying a voltage on the source terminal of the sensing transistor comprises increasing a voltage on the source terminal.

In one embodiment, in addition to the foregoing paragraph the following is performed. A voltage on the sense node is modified after determining a condition of the selected non-volatile storage element with respect to the first level. A determination is made whether the sensing transistor conducts in response to the modified voltage on the sense node. A condition of the selected non-volatile storage element is determined with respect to a third reference level based on whether the sensing transistor conducts in response to the modified voltage on the sense node. Modifying the voltage on the source terminal of the sensing transistor is performed after determining whether the sensing transistor conducts in response to the modified voltage on the sense node. The third reference level is between the first reference level and the second reference level.

One embodiment includes a non-volatile storage device comprising a plurality of non-volatile storage elements, a plurality of bit lines associated with the plurality of non-volatile storage elements, and managing circuitry coupled to the plurality of non-volatile storage elements and the plurality of bit lines. The managing circuitry comprises a plurality of sensing circuits. A sensing circuit comprises a charge storage device and a sensing transistor connected to the charge storage device. The managing circuitry develops a sense voltage on the charge storage device of a given sensing circuit. The given sensing circuit being associated with a first of the bit lines. The first bit line being associated with a selected non-volatile storage element of the plurality of non-volatile storage elements. The managing circuitry determines whether the sensing transistor in the given sensing circuit conducts in response to the sense voltage on the charge storage device. The managing circuitry determines a condition of the selected non-volatile storage element with respect to a first reference level based on whether the sensing transistor conducts in response to the sense voltage on the charge storage device. The managing circuitry modifies a voltage on the source terminal of the sensing transistor after determining the condition with respect to the first reference level. The managing circuitry determines whether the sensing transistor conducts in response to the sense voltage on the charge storage device after modifying the voltage on the source terminal of the sensing transistor. The managing circuitry determines a condition of the selected non-volatile storage element with respect to a second reference level based on whether the sensing transistor conducts in response to the sense voltage on the charge storage device after modifying the voltage on the source terminal of the sensing transistor.

One embodiment comprises method of operating non-volatile storage comprising the following. A sense voltage is developed on a sense capacitor that is coupled to a bit line. The sense capacitor has a bottom plate and a top plate. The sense capacitor is connected to a sensing transistor having a source terminal. A selected non-volatile storage element is associated with the bit line. A determination is made whether the sensing transistor conducts in response to the sense voltage on the top plate of the sense capacitor. A voltage on the bottom plate of the sense capacitor is reduced after determining whether the sensing transistor conducts in response to the sense voltage on the sense capacitor. A determination is made whether the sensing transistor conducts in response to the sense voltage on the top plate of the sense capacitor after boosting the voltage on the bottom plate of the sense capacitor. A voltage on the source terminal of the sensing transistor is increased after determining whether the sensing transistor conducts after boosting the voltage on the bottom plate. A determination is made whether the sensing transistor conducts in response to the sense voltage on the top plate of the sense capacitor after increasing the voltage on the source terminal of the sensing transistor. Conditions of the selected non-volatile storage element are determined with respect to a first reference level, a second reference revel, and a third reference level based on whether the sensing transistor conducted in the operations above.

In one embodiment first reference level in the above paragraph is a first soft bit reference level, the second reference revel is a second soft bit reference level, and the third reference level is a hard bit reference level.

One embodiment includes a 3D non-volatile storage device comprising a plurality of word lines layers, a plurality of insulator layers alternating with the word line layers in a stack, a plurality of non-volatile storage element strings, a plurality of bit lines associated with the non-volatile storage element strings, a plurality of sensing circuits each comprising a sense node and a sensing transistor connected to the sense node, and managing circuitry. Each non-volatile storage element string comprises a plurality of non-volatile storage elements. Each of the non-volatile storage elements is associated with one of the plurality of word lines. The managing circuitry is in communication with the plurality of word lines layers, the plurality of bit lines, the plurality of strings, and the plurality of sensing circuits. The managing circuitry develops a sense voltage on the sense node of a given sensing circuit. The given sensing circuit being associated with a first bit line of the bit lines. The first bit line being associated with a selected non-volatile storage element of the plurality of non-volatile storage elements. The managing circuitry determines whether the sensing transistor in the given sensing circuit conducts in response to the sense voltage on the sense node. The managing circuitry determines a condition of the selected non-volatile storage element with respect to a first level based on whether the sensing transistor conducts in response to the sense voltage on the sense node. The managing circuitry modifies a voltage on the source terminal of the sensing transistor after determining the condition with respect to the first level. The managing circuitry determines whether the sensing transistor conducts in response to the sense voltage on the sense node after modifying the voltage on the source terminal of the sensing transistor. The managing circuitry determines a condition of the selected non-volatile storage element with respect to a second level based on whether the sensing transistor conducts in response to the sense voltage on the sense node after modifying the voltage on the source terminal of the sensing transistor.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A non-volatile storage device, comprising:
    a selected non-volatile storage element;
    a charge storage device coupled to the selected non-volatile storage element and a sensing device having a control terminal coupled to the charge storage device,
    a pre-charge circuit and bit line connection circuit configured to develop a sense voltage on the charge storage device in response to a signal from a state machine, the sense voltage is developed based on connecting the selected non-volatile storage element to the charge storage device for a sense time;
    a processor configured to determine whether the sensing device activates in response to the sense voltage that was developed on the charge storage device based on connecting the selected non-volatile storage element to the charge storage device for the sense time;
    the processor further configured to determine a first condition of the selected non-volatile storage element with respect to a first reference level based on whether the sensing device activates in response to the sense voltage developed on the charge storage device,
    a voltage supply configured to modify a voltage on a second terminal of the sensing device other than the control terminal after determining the first condition in response to a signal from the state machine;
    the processor configured to determine whether the sensing device activates after modifying the voltage on the second terminal in response to the sense voltage that was developed on the charge storage device based on connecting the selected non-volatile storage element to the charge storage device for the sense time,
    the processor configured to determine a second condition of the selected non-volatile storage element with respect to a second reference level based on whether the sensing device activates in response to the sense voltage developed on the charge storage device after modifying the voltage on the second terminal of the sensing device.

2. The non-volatile storage device of claim 1, wherein the bit line connection circuit is configured to connect the charge storage device to a bit line for the sense time to allow a current from the bit line to discharge the charge storage device for the sense time.

3. The non-volatile storage device of claim 1, wherein the voltage supply increases a voltage on the second terminal in response to a signal from the state machine in order to modify the voltage on the second terminal.

4. The non-volatile storage device of claim 1, wherein the pre-charge circuit is configured to modify a voltage on the charge storage device after the first condition of the selected non-volatile storage element is determined with respect to the first reference level, the processor is configured to determine whether the sensing device activates in response to the modified voltage on the charge storage device, the processor is configured to determine a third condition of the selected non-volatile storage element with respect to a third reference level based on whether the sensing device activates in response to the modified voltage on the charge storage device, the voltage supply is configured to modify the voltage on the second terminal of the sensing device after it is determined whether the sensing device activates in response to the modified voltage on the charge storage device, the third reference level being between the first reference level and the second reference level.

5. The non-volatile storage device of claim 1, further comprising a data latch that stores a first result in response to whether the sensing device activates in response to the sense voltage on the charge storage device prior to modifying the voltage on the second terminal of the sensing device, the first result indicates whether the selected non-volatile storage element has a threshold voltage above or below a first target threshold voltage, the data latch stores a second result in response to whether the sensing device activates in response to the sense voltage on the charge storage device after modifying the voltage on the second terminal of the sensing device, the second result indicates whether the selected non-volatile storage element has a threshold voltage above or below a second target threshold voltage.

6. The non-volatile storage device of claim 1, wherein when the pre-charge circuit and bit line connection circuit develop the sense voltage on the charge storage device the voltage supply applies a voltage to a word line associated with the selected non-volatile storage element in response to a signal from the state machine.

7. The non-volatile storage device of claim 1, wherein the selected non-volatile storage element is part of a 3D memory array.

8. The non-volatile storage device of claim 1, wherein the selected non-volatile storage element comprises a charge trapping region that store data.

9. The non-volatile storage device of claim 1, wherein the sensing device comprises a transistor having a source terminal, wherein the second terminal is the source terminal.

10. A method comprising:
developing a sense voltage on a sense node connected to a sensing device, including connecting the sense node to a selected non-volatile storage element to discharge the sense node for a sense time;
determining a first condition of the selected non-volatile storage element with respect to a first reference level based on whether the sensing device activates in response to the sense voltage that was developed on the sense node based on discharging the sense node for the sense time;
modifying a voltage on a node of the sensing device after determining the first condition with respect to the first reference level; and
determining a second condition of the selected non-volatile storage element with respect to a second reference level based on whether the sensing device activates after modifying the voltage on the node of the sensing device in response to the sense voltage that was developed on the sense node based on discharging the sense node for the sense time.

11. The method of claim 10, wherein the modifying a voltage on the node of the sensing device comprises:
increasing a voltage on the sense node of the sensing device.

12. The method of claim 10, wherein the developing a sense voltage on a sense node comprises:
charging the sense node;
connecting the sense node to a bit line that is associated with the selected non-volatile storage element; and
allowing a current from the bit line to discharge the sense node for the sense time.

13. The method of claim 10, further comprising:
modifying a voltage on the sense node after determining the first condition of the selected non-volatile storage element with respect to the first reference level;
determining whether the sensing device activates in response to the modified voltage on the sense node prior to modifying the voltage on the node of the sensing device; and
determining a third condition of the selected non-volatile storage element with respect to a third reference level based on whether the sensing device activates in response to the modified voltage on the sense node prior to modifying the voltage on the node of the sensing device, wherein the modifying a voltage on a node of the sensing device is performed after determining whether the sensing device activates in response to the modified voltage on the sense node, the third reference level being between the first reference level and the second reference level.

14. The method of claim 10, wherein the first reference level is whether the selected non-volatile storage element has a threshold voltage above or below a first threshold voltage, wherein the second reference level is whether the selected non-volatile storage element has a threshold voltage above or below a second threshold voltage.

15. The method of claim 10, further comprising:
applying a voltage to a word line associated with the selected non-volatile storage element;
wherein connecting the sense node to the selected non-volatile storage element to discharge the sense node for the sense time comprises allowing current from a bit line associated with the selected non-volatile storage element that results from applying the voltage to the word line to discharge the sense node for the sense time.

16. The method of claim 10, wherein the first reference level is a low verify level for a state and the second reference level is a high verify level for the same state.

17. The method of claim 10, wherein the sensing device is a sensing transistor comprising a source terminal, wherein modifying the voltage on the node of the sensing device comprises modifying a voltage on the source terminal of the sensing transistor.

18. A 3D non-volatile storage device comprising:
a plurality of word line layers;
a plurality of insulator layers alternating with the word line layers in a stack;
a plurality of non-volatile storage element strings, each non-volatile storage element string comprises a plurality of non-volatile storage elements, each of the nonvolatile storage elements is associated with one of the plurality of word line layers;

a plurality of bit lines associated with the non-volatile storage element strings;

a plurality of sensing circuits each comprising a sense node and a sensing transistor connected to the sense node; and managing circuitry in communication with the plurality of word line layers, the plurality of bit lines, the plurality of strings, and the plurality of sensing circuits, wherein the managing circuitry develops a sense voltage on the sense node of a given sensing circuit, the given sensing circuit being associated with a first bit line of the bit lines, the first bit line being associated with a selected non-volatile storage element of the plurality of non-volatile storage elements, wherein the managing circuitry determines whether the sensing transistor in the given sensing circuit conducts in response to the sense voltage on the sense node, wherein the managing circuitry determines a condition of the selected non-volatile storage element with respect to a first level based on whether the sensing transistor conducts in response to the sense voltage on the sense node, wherein the managing circuitry modifies a voltage on a source terminal of the sensing transistor after determining the condition with respect to the first level, wherein the managing circuitry determines whether the sensing transistor conducts in response to the sense voltage on the sense node after modifying the voltage on the source terminal of the sensing transistor, wherein the managing circuitry determines a condition of the selected non-volatile storage element with respect to a second level based on whether the sensing transistor conducts in response to the sense voltage on the sense node after modifying the voltage on the source terminal of the sensing transistor.

19. A method of operating non-volatile storage, the method comprising:

a) developing a sense voltage on a sense capacitor that is coupled to a bit line, the sense capacitor having a bottom plate and a top plate, wherein the sense capacitor is connected to a sensing transistor having a source terminal, wherein a selected non-volatile storage element is associated with the bit line;

b) determining whether the sensing transistor conducts in response to the sense voltage on the top plate of the sense capacitor;

c) reducing a voltage on the bottom plate of the sense capacitor after determining whether the sensing transistor conducts in response to the sense voltage on the sense capacitor;

d) determining whether the sensing transistor conducts in response to the sense voltage on the top plate of the sense capacitor after boosting the voltage on the bottom plate of the sense capacitor;

e) increasing a voltage on the source terminal of the sensing transistor after determining whether the sensing transistor conducts after boosting the voltage on the bottom plate;

f) determining whether the sensing transistor conducts in response to the sense voltage on the top plate of the sense capacitor after increasing the voltage on the source terminal of the sensing transistor; and g) detecting conditions of the selected non-volatile storage element with respect to a first reference level, a second reference level, and a third reference level based on whether the sensing transistor conducted in said b), said d) and said f), respectively.

20. The method of claim 19, wherein the developing a sense voltage on a sense capacitor that is coupled to a bit line comprises:

causing the selected non-volatile storage element to create a current in the bit line; and discharging the sense capacitor for a sense time.

* * * * *